(12) United States Patent
Takahashi et al.

(10) Patent No.: US 9,106,200 B2
(45) Date of Patent: Aug. 11, 2015

(54) PIEZOELECTRIC VIBRATING PIECE AND PIEZOELECTRIC DEVICE

(75) Inventors: Takehiro Takahashi, Saitama (JP); Shuichi Mizusawa, Saitama (JP); Masakazu Harada, Saitama (JP); Hiroaki Yamada, Saitama (JP); Takumi Ariji, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 352 days.

(21) Appl. No.: 13/539,488

(22) Filed: Jul. 1, 2012

(65) Prior Publication Data
US 2013/0020911 A1    Jan. 24, 2013

(30) Foreign Application Priority Data

Jul. 21, 2011    (JP) .................... 2011-159493

(51) Int. Cl.
| H01L 41/053 | (2006.01) |
| H03H 9/13 | (2006.01) |
| H03H 3/02 | (2006.01) |
| H03H 9/02 | (2006.01) |
| H03H 9/10 | (2006.01) |
| H03H 9/17 | (2006.01) |

(52) U.S. Cl.
CPC .............. H03H 9/131 (2013.01); H03H 3/02 (2013.01); H03H 9/02133 (2013.01); H03H 9/02157 (2013.01); H03H 9/1035 (2013.01); H03H 9/177 (2013.01); H03H 2003/021 (2013.01)

(58) Field of Classification Search
CPC ... H03H 9/177; H03H 9/0207; H03H 9/1021; H03H 9/1014; H01L 41/053; G01C 19/5663
USPC .......................... 310/320, 344, 351
See application file for complete search history.

(56) References Cited

U.S. PATENT DOCUMENTS 4,267,479 A * 5/1981 Kato ........................ 310/348
7,365,477 B2   4/2008 Tanaka
(Continued)

FOREIGN PATENT DOCUMENTS

| EP | 1696561 | 8/2006 |
| JP | H05-226963 | 9/1993 |

(Continued)

OTHER PUBLICATIONS

Online Translation of JP 2004-286585, Kobayashi.*
(Continued)

*Primary Examiner* — Derek Rosenau
*Assistant Examiner* — Bryan Gordon
(74) *Attorney, Agent, or Firm* — Jianq Chyun IP Office

(57) ABSTRACT

A piezoelectric vibrating device and a piezoelectric vibrating piece including an excitation unit, a framing portion and a connecting portion are provided. The excitation unit includes a first side extending in a first direction and a second side extending in a second direction. The connecting portion has a thickness of a first thickness in a third direction perpendicular to the first direction and the second direction. The excitation unit includes a first region, a second region and a third region. The pair of excitation electrodes are disposed on the first region. The second region with the first thickness is directly connected to the connecting portion. The third region is disposed between the first region and the second region. The third region has a thickness in the third direction of a second thickness. The second region has a thickness in the third direction that is thicker than the second thickness.

17 Claims, 16 Drawing Sheets

(56) References Cited

U.S. PATENT DOCUMENTS

| | | | |
|---|---|---|---|
| 2008/0079334 A1* | 4/2008 | Yong et al. | 310/361 |
| 2010/0207696 A1* | 8/2010 | Sayama | 331/158 |
| 2010/0270891 A1* | 10/2010 | Kohda et al. | 310/344 |
| 2011/0163637 A1* | 7/2011 | Hashi | 310/344 |
| 2012/0032562 A1* | 2/2012 | Mizusawa | 310/344 |
| 2012/0139391 A1* | 6/2012 | Mizusawa et al. | 310/344 |

FOREIGN PATENT DOCUMENTS

| | | | |
|---|---|---|---|
| JP | H08-78997 | | 3/1996 |
| JP | H10-145179 | | 5/1998 |
| JP | 2003-101377 | | 4/2003 |
| JP | 2004-286585 | * | 10/2004 |
| JP | 2006-238263 | | 9/2006 |
| JP | 2006-238266 | | 9/2006 |
| JP | 2006-254210 | | 9/2006 |
| JP | 2008-022378 | | 1/2008 |

OTHER PUBLICATIONS

"Office Action of Japan Counterpart Application", issued on May 18, 2015, pp. 1-3, in which the listed references were cited.

* cited by examiner

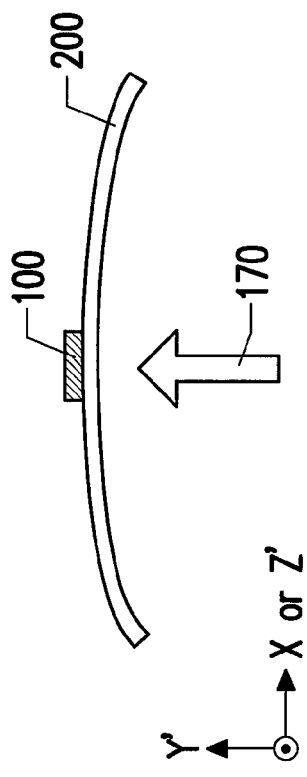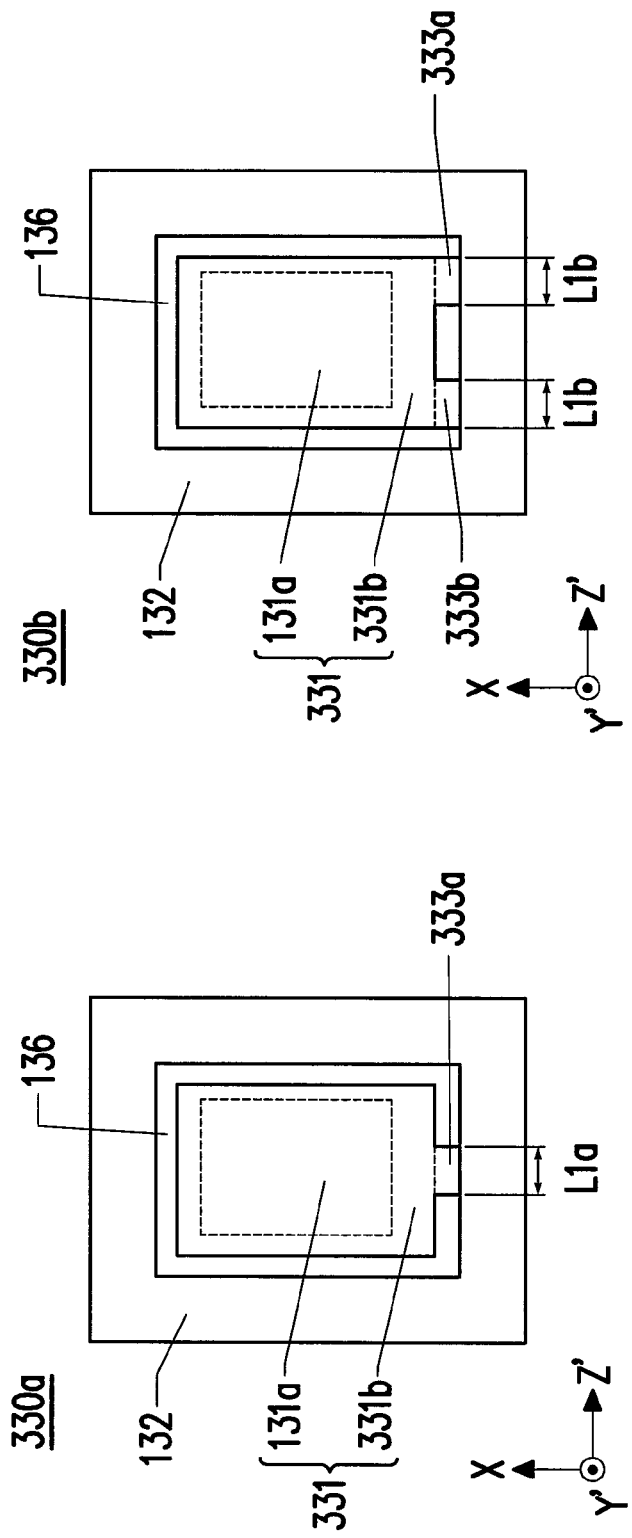

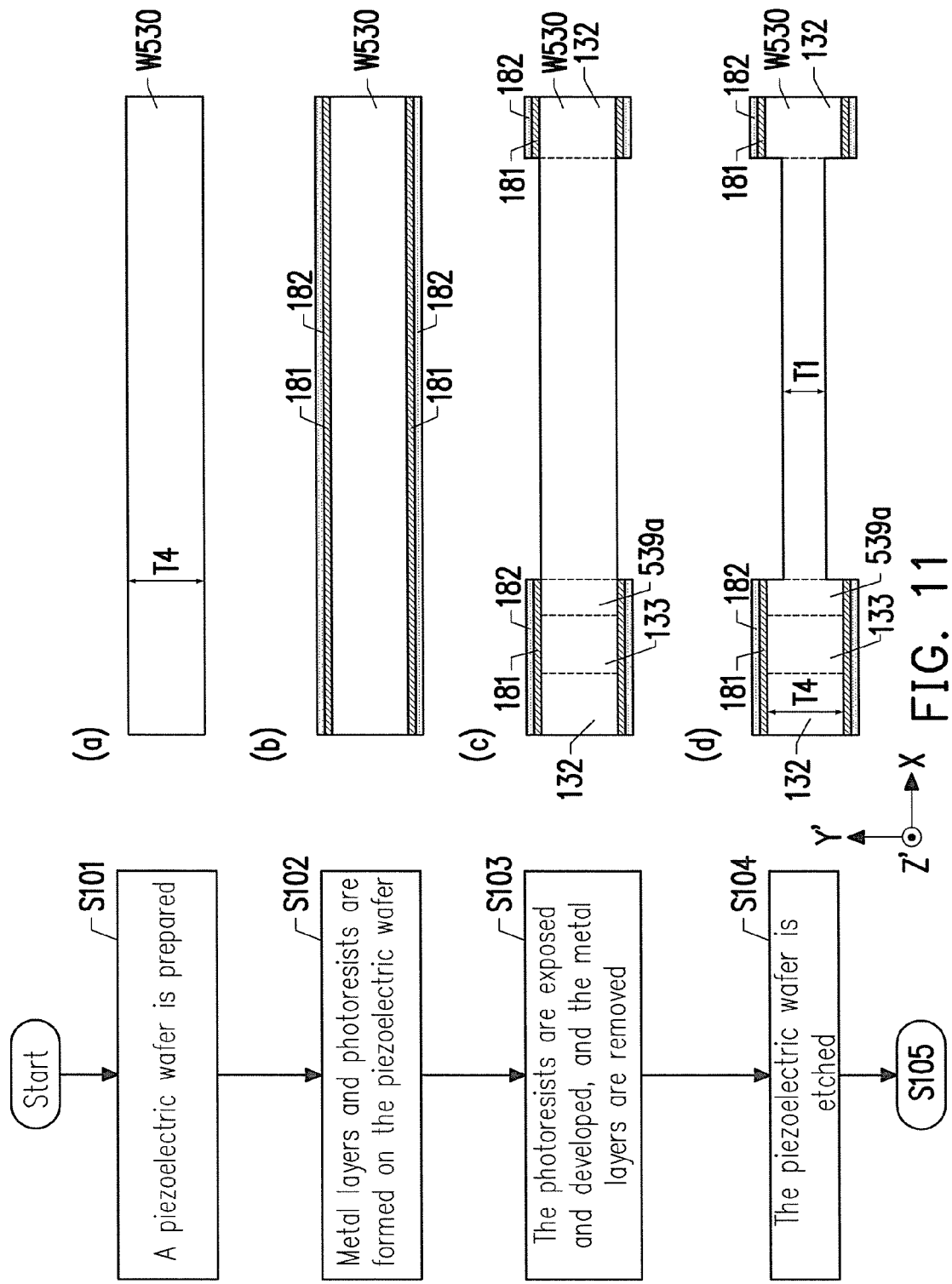

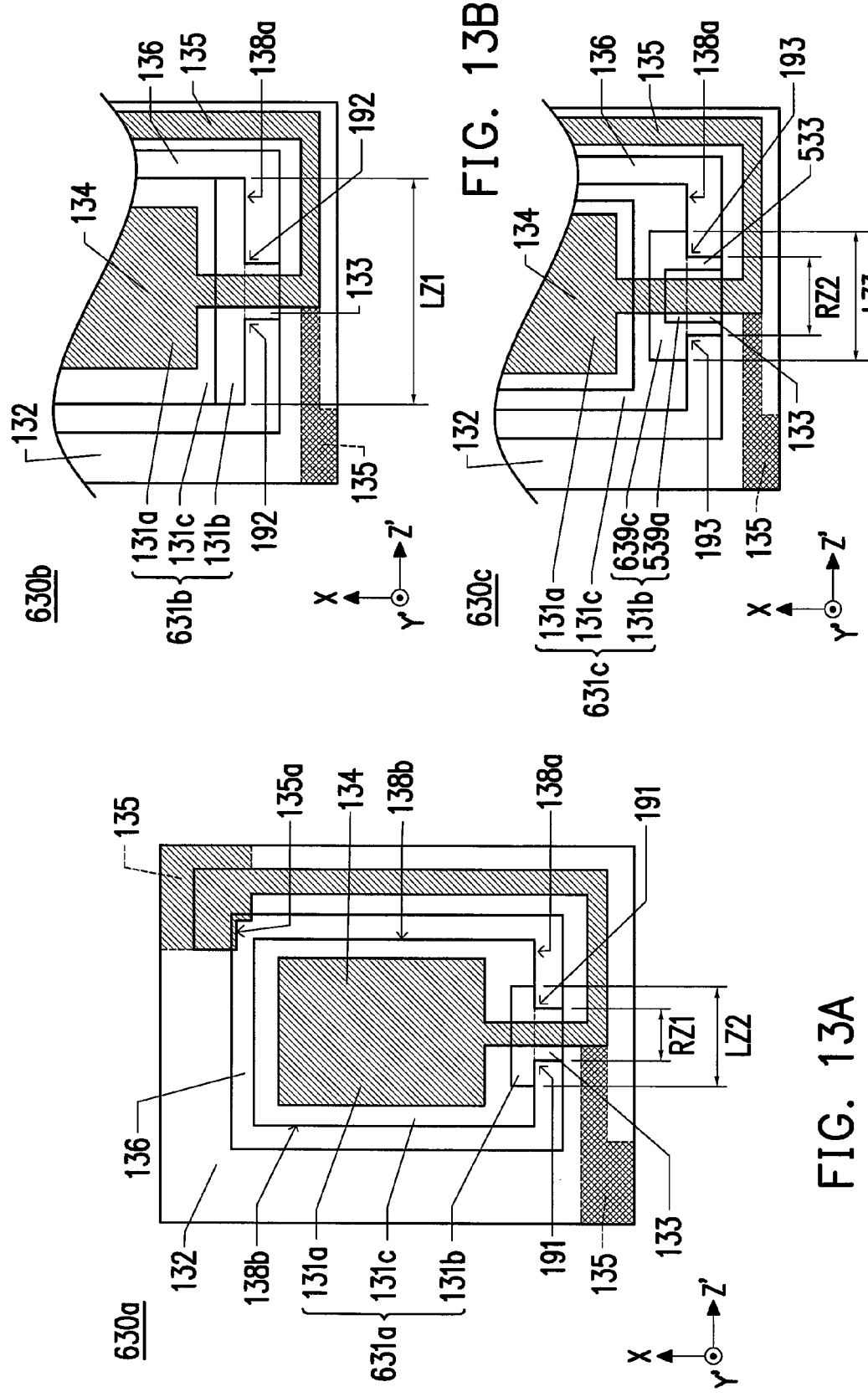

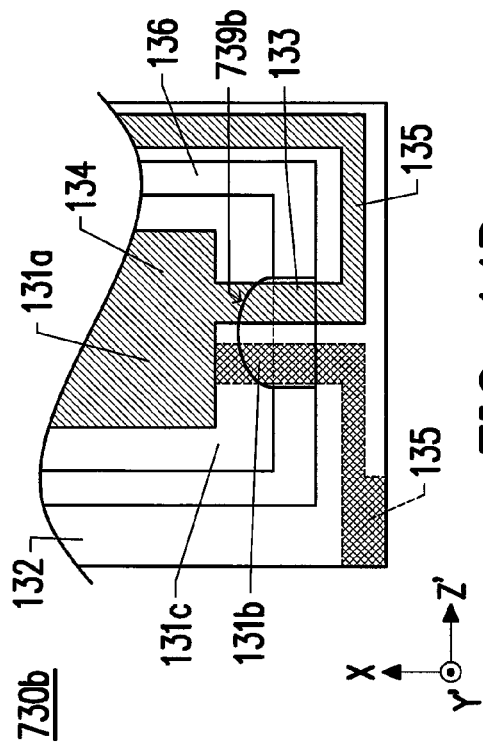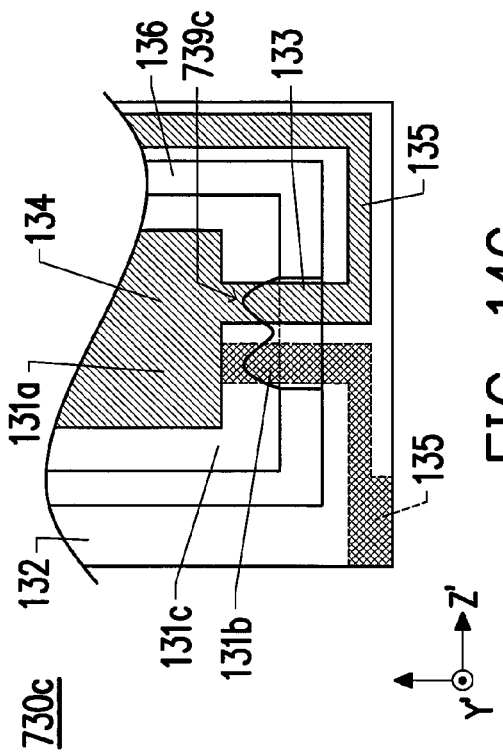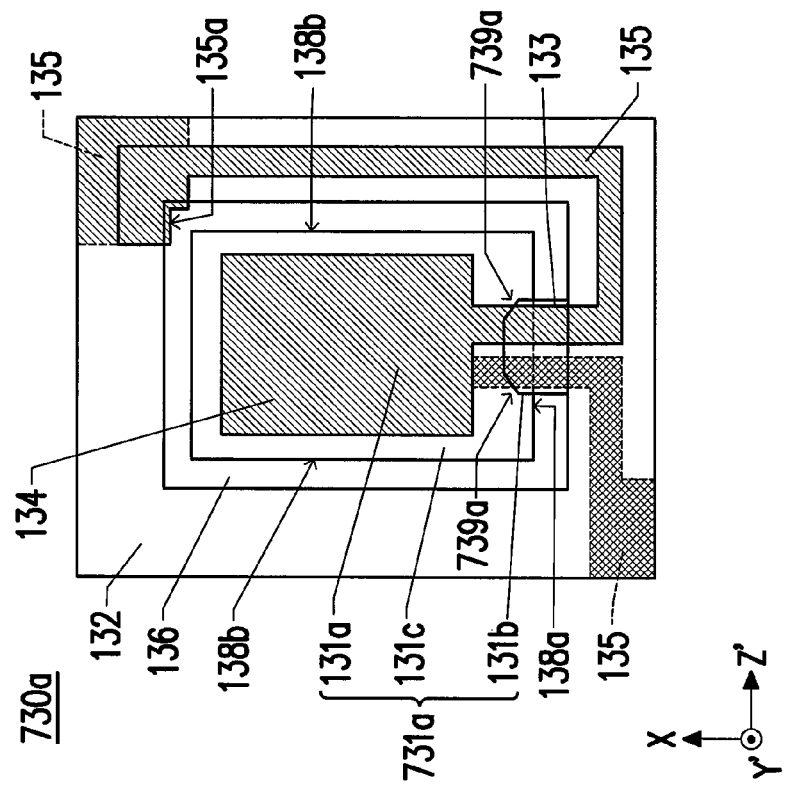

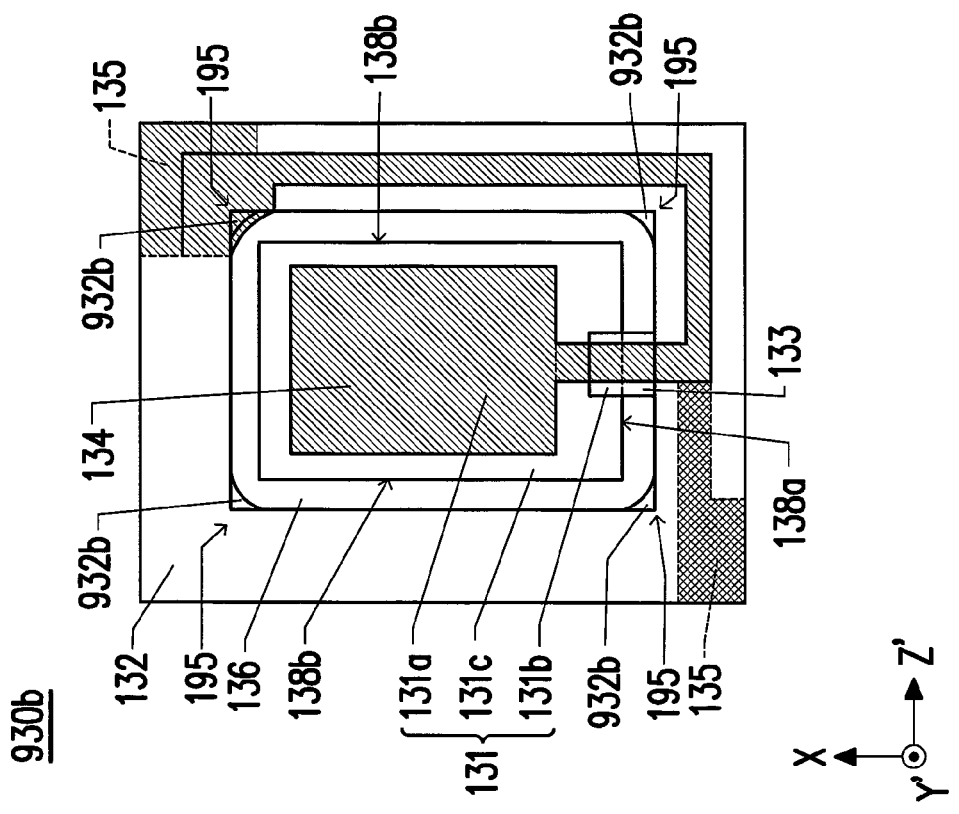
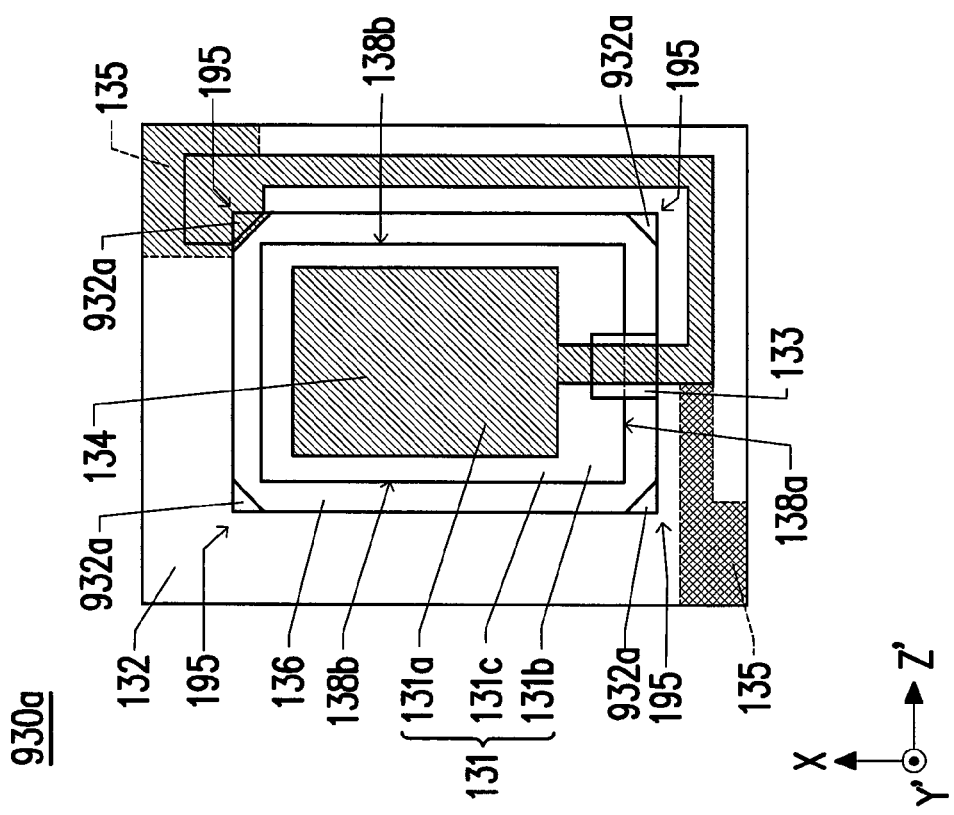

PIEZOELECTRIC VIBRATING PIECE AND PIEZOELECTRIC DEVICE

CROSS-REFERENCE TO RELATED APPLICATIONS

This application claims the priority benefit of Japan application serial no. 2011-159493, filed on Jul. 21, 2011. The entirety of the above-mentioned patent application is hereby incorporated by reference herein and made a part of this specification.

FIELD

This disclosure pertains to piezoelectric vibrating pieces and piezoelectric devices that reduce the influence of bending stress on their excitation units.

DESCRIPTION OF THE RELATED ART

A known piezoelectric vibrating piece includes an excitation unit, which vibrates at a predetermined vibration frequency, a framing portion, which surrounds the excitation unit, and a connecting portion that connects the excitation unit and the framing portion together. The piezoelectric vibrating piece forms a piezoelectric device with a lid plate and a base plate, which are bonded on both front and back sides of the framing portion. The piezoelectric device is used to be mounted on, for example, a printed circuit board. A problem arises in that impact applied to the connecting portion due to dropping of the piezoelectric device would exert stress on the connecting portion, thus it may cause damage to the connecting portion.

To solve such problem, for example, Japanese Unexamined Patent Publication No. 2006-238263 discloses a piezoelectric vibrating piece that is formed of a groove portion, which has a connecting portion formed in a recessed shape at both front and hack sides of the excitation unit, and flat portions, which are disposed at the same surfaces of both front and back sides of the excitation unit. In the piezoelectric vibrating piece of Japanese Unexamined Patent Publication No. 2006-238263, two connecting portions are formed of the groove portions and the flat portions so as to prevent stress concentration at the two connecting portions. This improves the impact resistance of the piezoelectric vibrating piece in Japanese Unexamined Patent Publication No. 2006-238263.

On the other hand, the piezoelectric device is possibly exerted bending stress from the printed circuit board. The bending stress on the piezoelectric device affects the piezoelectric vibrating piece and changes the property of vibration frequency of the excitation unit. Thus, the piezoelectric vibrating piece is required not only to have impact resistance, but also to reduce the bending stress on the excitation unit. Stress applied to the excitation unit changes the property of vibration frequency of the excitation unit. Since the excitation unit disclosed in Japanese Unexamined Patent Publication No. 2006-238263 is supported by the two connecting portions, the bending stress affects the excitation unit.

Therefore, there is a need for a piezoelectric vibrating piece and a piezoelectric device that have impact resistance and reduce the influence of bending stress on the excitation unit.

SUMMARY

A first aspect of a piezoelectric vibrating piece includes an excitation unit in a rectangular shape, a framing portion, and a connecting portion. The excitation unit includes a first side and a second side. The first side extends in a first direction. The second side extends in a second direction perpendicular to the first direction. The framing portion surrounds the excitation unit. The connecting portion connects the first side of the excitation unit and the framing portion together. The connecting portion has a thickness of a first thickness in a third direction perpendicular to the first direction and the second direction. The excitation unit includes a first region, a second region, and a third region. The pair of excitation electrodes are disposed on both main surfaces of the first region. The second region includes at least a part of the first side. The second region with the first thickness is directly connected to the connecting portion. The third region is disposed between the first region and the second region. The third region is a region other than the first region and the second region. The third region has a thickness in the third direction of a second thickness. The second region has a thickness in the third direction. The thickness in the third direction is thicker than the second thickness.

In the first aspect, a second aspect of a piezoelectric vibrating piece includes the first side that has a length shorter than a length of the second side. In the first aspect or the second aspect, a third aspect of a piezoelectric vibrating piece includes the connecting portion that is connected to a center of the first side. In any one of the first aspect to the third aspect, a fourth aspect is directed to a piezoelectric vibrating piece where a thickness of the first region in the third direction is thicker than the second thickness. In the fourth aspect, a fifth aspect of a piezoelectric vibrating piece includes the first region that is connected to the third region by a first taper surface. The first taper surface has a predetermined angle with respect to the third direction. In any one of the first aspect to the fifth aspect, a sixth aspect of a piezoelectric vibrating piece includes the second region that is connected to the third region by a second taper surface. The second taper surface has a predetermined angle with respect to the third direction.

In any one of the first aspect to the fifth aspect, a seventh aspect of a piezoelectric vibrating piece includes a first auxiliary connecting portion disposed on a side surface in the first direction of the connecting portion. The first auxiliary connecting portion has a third thickness. The third thickness is thinner than the first thickness and thicker than the second thickness. The second region of the excitation unit includes a first connecting region and a second connecting region. The first connecting region has the first thickness. The first connecting region is directly connected to the connecting portion. The second connecting region has the third thickness. The second connecting region is connected to the first auxiliary connecting portion. In the seventh aspect, an eighth aspect of a piezoelectric vibrating piece includes the second connecting region that is disposed in a whole region between the first connecting region and the third region. In any one of the fourth aspect to the sixth aspect, a ninth aspect directed to a piezoelectric vibrating piece where the thickness of the first region in the third direction is the first thickness.

In the seventh aspect or the eighth aspect, a tenth aspect is directed to a piezoelectric vibrating piece where the thickness of the first region in the third direction is the third thickness. In any one of the first aspect to the sixth aspect, an eleventh aspect of a piezoelectric vibrating piece further includes a second auxiliary connecting portion disposed on a side surface in the first direction of the connecting portion. The second auxiliary connecting portion has the second thickness. In the eleventh aspect, a twelfth aspect of a piezoelectric vibrating piece includes the second auxiliary connecting portion that connects the end surface in the first direction of the connecting portion to the first side and the framing portion with one of a curved surface and a planar surface. The planar surface has a normal line. The normal line is inclined from the first direction to the second direction by a predetermined angle.

In any one of the first aspect to the twelfth aspect, a thirteenth aspect is directed to a piezoelectric vibrating piece where a corner portion on a side surface at the excitation electrode side of the second region is chamfered to have one of a curved surface and a planar surface. In any one of the first aspect to the thirteenth aspect, a fourteenth aspect is directed to a piezoelectric vibrating piece where the connecting portion has a width of a first width in the first direction, the second region has a width of a second width in the first direction, the second region includes the first side with the second width, and the first width is smaller than the second width. In any one of the first aspect to the fourteenth aspect, a fifteenth aspect of a piezoelectric vibrating piece further includes auxiliary frame portions disposed at respective four corners on side surfaces at the excitation unit side of the framing portion. The auxiliary frame portion includes a side surface facing the excitation unit. The side surface faces the excitation unit having one of a curved surface and a planar surface. The planar surface has a normal line inclined from the first direction to the second direction by a predetermined angle. In the fifteenth aspect, a sixteenth aspect is directed to a piezoelectric vibrating piece where a thickness of the auxiliary frame portion in the third direction is one of a thickness of the framing portion in the third direction, the first thickness, and the second thickness. A seventeenth aspect of a piezoelectric device includes the piezoelectric vibrating piece according to any one of the first aspect to the sixteenth aspect, a lid plate bonded to one main surface of the framing portion in the piezoelectric vibrating piece, and a base plate bonded to another main surface of the framing portion in the piezoelectric vibrating piece.

With the piezoelectric vibrating piece and the piezoelectric device according to the present invention, the piezoelectric vibrating piece has impact resistance, and the influence of the bending stress on the excitation unit is reduced.

BRIEF DESCRIPTION OF THE DRAWINGS

FIG. 5A is a schematic cross-sectional view of a printed circuit hoard 200 and the piezoelectric device 100 mounted on the printed circuit board 200.

FIG. 5B is a schematic plan view of a piezoelectric vibrating piece 330a.

FIG. 5C is a schematic plan view of a piezoelectric vibrating piece 330b.

FIG. 6 is a graph showing stress on the center of a first region 131a.

FIG. 9B is a cross-sectional view of the piezoelectric vibrating piece 530a.

FIG. 9C is a cross-sectional view of the piezoelectric vibrating piece 530a.

FIG. 11 includes both schematic diagram (right) and flow chart (left) of a method for manufacturing the piezoelectric vibrating piece 530b, wherein the schematic diagram includes four parts: (a), (b), (c) and (d), and each part corresponds to the steps of the flow chart of the manufacturing method.

FIG. 13A is a plan view of a piezoelectric vibrating piece 630a according to a fourth embodiment.

FIG. 13B is a partial plan view of a piezoelectric vibrating piece 630b.

FIG. 13C is a partial plan view of a piezoelectric vibrating piece 630c.

FIG. 14A is a plan view of a piezoelectric vibrating piece 730a.

FIG. 14B is a partial plan view of a piezoelectric vibrating piece 730b.

FIG. 14C is a partial plan view of a piezoelectric vibrating piece 730c.

FIG. 15A is a partial plan view of a piezoelectric vibrating piece 830a.

FIG. 16A is a plan view of a piezoelectric vibrating piece 930a.

FIG. 16B is a plan view of a piezoelectric vibrating piece 930b.

DETAILED DESCRIPTION

Each embodiment of the present invention is described below by referring to the accompanying drawings. It will be understood that the scope of the disclosure is not limited to the described embodiments, unless otherwise stated.

First Embodiment

<Configuration of a Piezoelectric Device 100>

Figure 1:
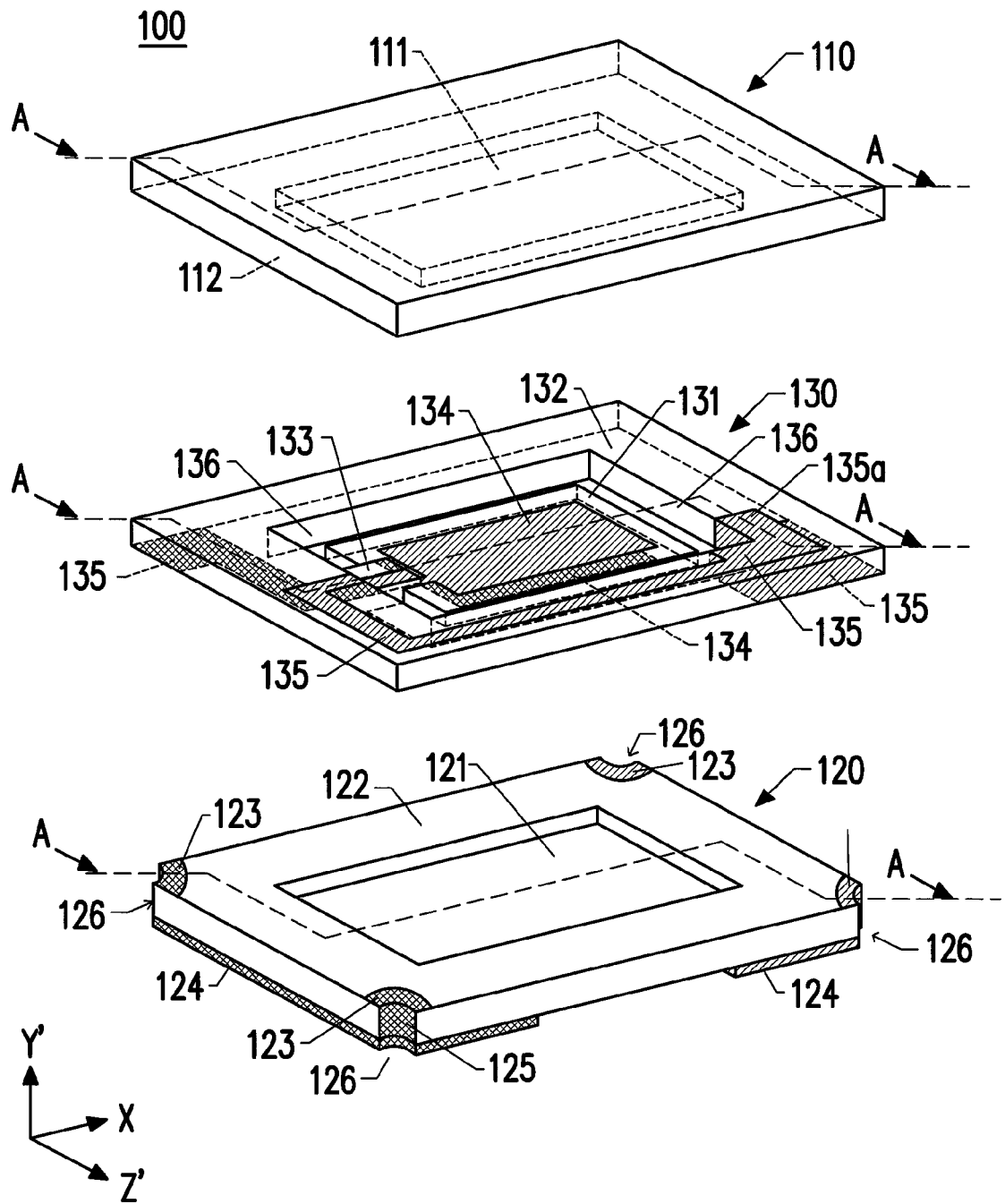
FIG. 1 is an exploded perspective view of a piezoelectric device 100 according to a first embodiment.

FIG. 1 is an exploded perspective view of a piezoelectric device 100. The piezoelectric device 100 includes a lid plate 110, a base plate 120 and a piezoelectric vibrating piece 130. The piezoelectric vibrating piece 130 employs, for example, an AT-cut quartz-crystal vibrating piece. The AT-cut quartz-crystal vibrating piece has a principal surface (in the Y-Z plane) that is tilted by 35° 15' about the Y axis of the crystal coordinate system (XYZ) in the direction from the Z axis to the Y axis around the X axis. In the following description, the new axises tilted with reference to the axis directions of the AT-cut quartz-crystal vibrating piece are denoted as the Y' axis and the Z' axis. Therefore, in description of the piezoelectric device 100, the longitudinal direction of the piezoelectric device 100 is referred as the X axis direction, the height direction of the piezoelectric device 100 is referred as the Y' axis direction, and the direction perpendicular to the X axis and Y' axis directions is referred as the Z' axis direction.

The piezoelectric vibrating piece 130 includes an excitation unit 131, which vibrates at a predetermined vibration frequency, a framing portion 132, which surrounds the excitation unit 131, and a connecting portion 133, which connects the excitation unit 131 and the framing portion 132 together. Regions other than the connecting portion 133 located between the excitation unit 131 and the framing portion 132 constitute a space 136 which passes through the piezoelectric vibrating piece 130 in the Y' axis direction. Excitation electrodes 134 are formed on a surface at +Y' axis side and on a surface at −Y' axis side of the excitation unit 131. Extraction electrodes 135 are respectively extracted from the excitation electrodes 134 and passes through the connecting portion 133 to the framing portion 132.

The base plate 120 is arranged at −Y' axis side of the piezoelectric vibrating piece 130. The base plate 120 is formed in a rectangular shape that has long sides in the X axis direction and short sides in the Z' axis direction. A pair of mounting terminals 124 are formed on a surface at −Y' axis side of the base plate 120. Through the mounting terminals 124 being soldered and electrically connected to a printed circuit board or the like, the piezoelectric device 100 is mounted on the printed circuit board or the like. Castellations 126 are formed on side surfaces at four corners of the base plate 120, while side-surface electrodes 125 are formed at the castellations 126. A recess 121 is formed on a surface at the +Y' axis side of the base plate 120, and a bonding surface 122 is formed in a peripheral area of the recess 121. Connecting electrodes 123 are formed at four corners, which are peripheral areas of the castellations 126, of the bonding surface 122. The connecting electrodes 123 are electrically connected to the mounting terminals 124 via the side-surface electrodes 125, which are formed at the castellations 126. The base plate 120 is bonded on a surface at the −Y' axis side of the framing portion 132 of the piezoelectric vibrating piece 130 via a sealing material 141 (see FIGS. 2A and 2B) at the bonding surface 122. At this time, the connecting electrodes 123 and the extraction electrodes 135 of the piezoelectric vibrating piece 130 are electrically connected.

The lid plate 110 is arranged at the +Y' axis side of the piezoelectric vibrating piece 130. A recess 111 is formed on a surface at −Y' axis side of the lid plate 110, and a bonding surface 112 is formed in a peripheral area of the recess 111. The lid plate 110 is bonded on a surface at the +Y' axis side of the framing portion 132 in the piezoelectric vibrating piece 130 via the sealing material 141 (see FIGS. 2A and 2B) at the bonding surface 112.

Figure 2A:
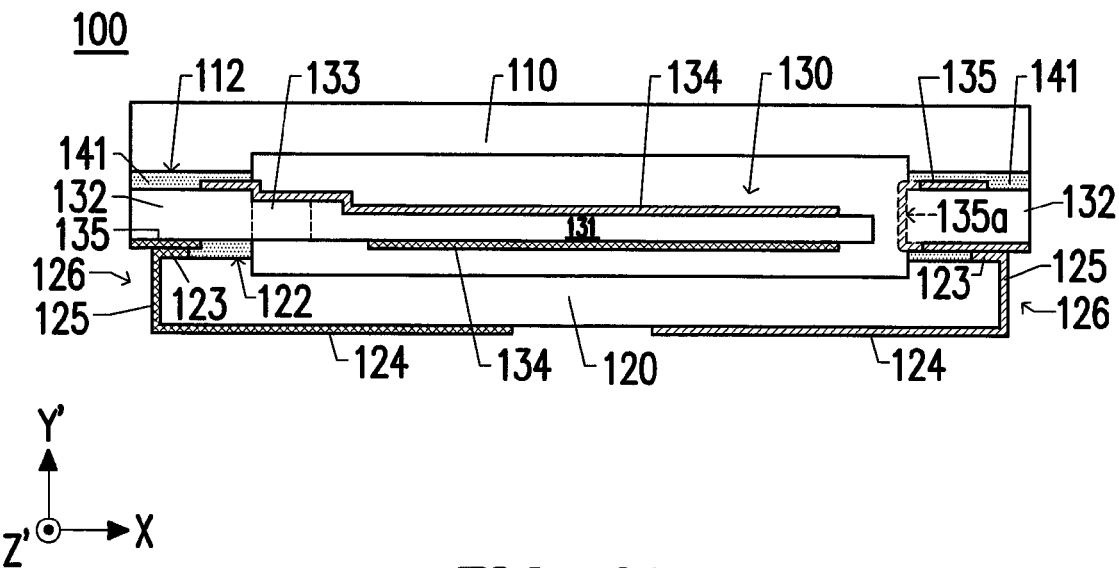
FIG. 2A is a cross-sectional view of the piezoelectric device 100.

FIG. 2A is a cross-sectional view of the piezoelectric device 100. FIG. 2A is the cross-sectional view taken along the line A-A of FIG. 1. The piezoelectric device 100 is bonded to the bonding surface 112 of the lid plate 110 via the sealing material 141, at the surface on the +Y' axis side of the framing portion 132 in the piezoelectric vibrating piece 130, and bonded to the bonding surface 122 of the base plate 120 via the sealing material 141, at the surface on the −Y' axis side of the framing portion 132. When the framing portion 132 of the piezoelectric vibrating piece 130 is bonded to the bonding surface 122 of the base plate 120, the extraction electrodes 135, which are formed on the surface at the −Y' axis side of the framing portion 132, are electrically connected to the connecting electrodes 123, which are formed on the bonding surface 122 of the base plate 120. Accordingly, the excitation electrodes 134 are electrically connected to the mounting terminals 124 via the extraction electrodes 135, the connecting electrodes 123, and the side-surface electrodes 125.

Figure 2B:
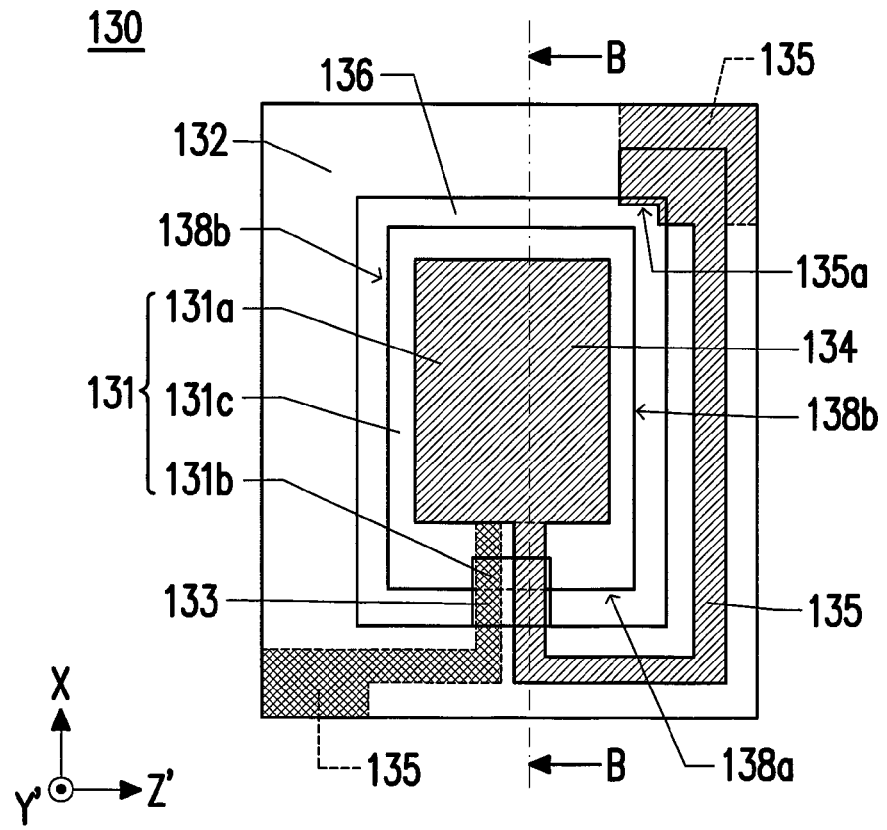
FIG. 2B is a plan view of a piezoelectric vibrating piece 130.

FIG. 2B is a plan view of the piezoelectric vibrating piece 130. The piezoelectric vibrating piece 130 includes the excitation unit 131, the framing portion 132, which surrounds the excitation unit 131, and one connecting portion 133, which connects the excitation unit 131 and the framing portion 132 together. The connecting portion 133 is connected to the center of a first side 138a, which is a side at the −X axis side of the excitation unit 131, and extends in the −X axis direction to be connected to the framing portion 132. In addition, regions other than the connecting portion 133 located between the excitation unit 131 and the framing portion 132 constitute the space 136, which passes through the piezoelectric vibrating piece 130 in the Y' axis direction. The excitation unit 131 is formed in a rectangular shape that includes the first side 138a and second sides 138b, wherein the second sides 138b are sides at the +Z' axis side and the −Z' axis side of the excitation unit 131. The excitation unit 131 can be separated into a first region 131a where the excitation electrodes 134 are formed, a second region 131b that is directly connected to the connecting portion 133, and a third region 131c that is a region other than the first region 131a and the second region 131b. The third region 131c is formed between the first region 131a and the second region 131b.

The extraction electrode 135 formed on the surface at the +Y' axis side of the piezoelectric vibrating piece 130 and extracted from the excitation electrodes 134 passes through the third region 131c, the second region 131b, and the connecting portion 133, connected to the framing portion 132 at the −X axis side, extends in the +X axis direction via the +Z' axis side of the framing portion 132, extracted from the surface at +Y' axis side to the surface at the −Y' axis side via a side surface 135a including a corner portion at the +Z' axis side and the +X axis side of the framing portion 132, which faces the space 136 (see FIG. 1, FIG. 2A, and FIG. 2B), and formed over the corner portion at the +Z' axis side and the +X axis side of the surface at the −Y' axis side of the framing portion 132. The extraction electrode 135 extracted from the excitation electrode 134 and formed on the surface at the −Y' axis side, is extracted via the second region 131b and the connecting portion 133 to the framing portion 132 at the −X axis side, extends in the −Z' axis direction, and formed over the corner portion at the −Z' axis side and the −X axis side on the surface at the −Y' axis side of the framing portion 132.

Figure 3A:
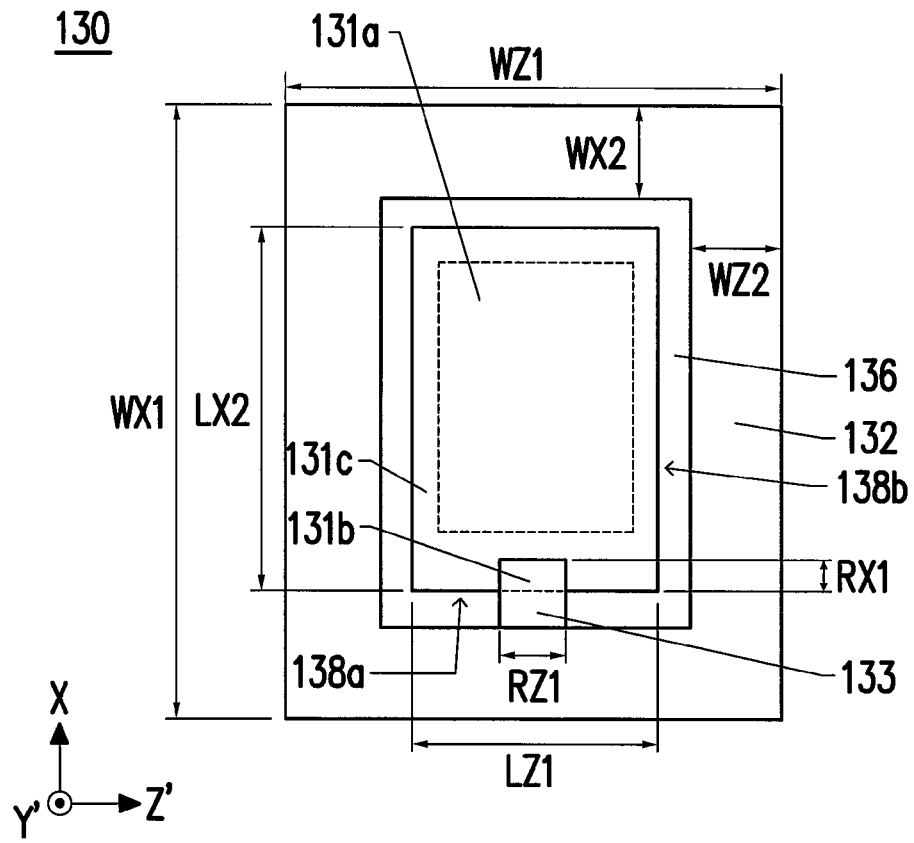
FIG. 3A is a plan view of the piezoelectric vibrating piece 130 without electrodes.

FIG. 3A is a plan view of the piezoelectric vibrating piece 130 without electrodes. The excitation unit 131 has the first side 138a with a length LZ1 and a second side 138b with a length LX2. In the piezoelectric vibrating piece 130, the first side 138a is the short side of the excitation unit 131 and the second side 138b is the long side. Thus, the length LZ1 is smaller than the length LX2. The framing portion 132 of the piezoelectric vibrating piece 130 has a length WX1 as the whole length in the X axis direction, a length WZ1 as the whole length in the Z' axis direction, a width of WX2 as a width in the X axis direction of a part of the framing portion 132 that extends in the Z' axis direction, and a width of WZ2 as a width in the Z' axis direction of a part of the framing portion 132 that extends in the X axis direction. In the piezoelectric vibrating piece 130, for example, the respective lengths and widths are formed such that the length LZ1 is 1.0 mm, the length LX2 is 1.4 mm, the length WX1 is 2.0 mm, the width WX2 is 0.2 mm, the length WZ1 is 1.6 mm, and the width WZ2 is 0.2 mm. Assume that the piezoelectric vibrating piece 130 includes the connecting portion 133 with a length in the Z' axis direction defined as a length RZ1 and the second region 131b with a length in the X axis direction defined as a length RX1. The piezoelectric vibrating piece 130 is formed to have, for example, the length RZ1 of 0.2 mm and the length RX1 of 0.1 mm.

Figure 3B:
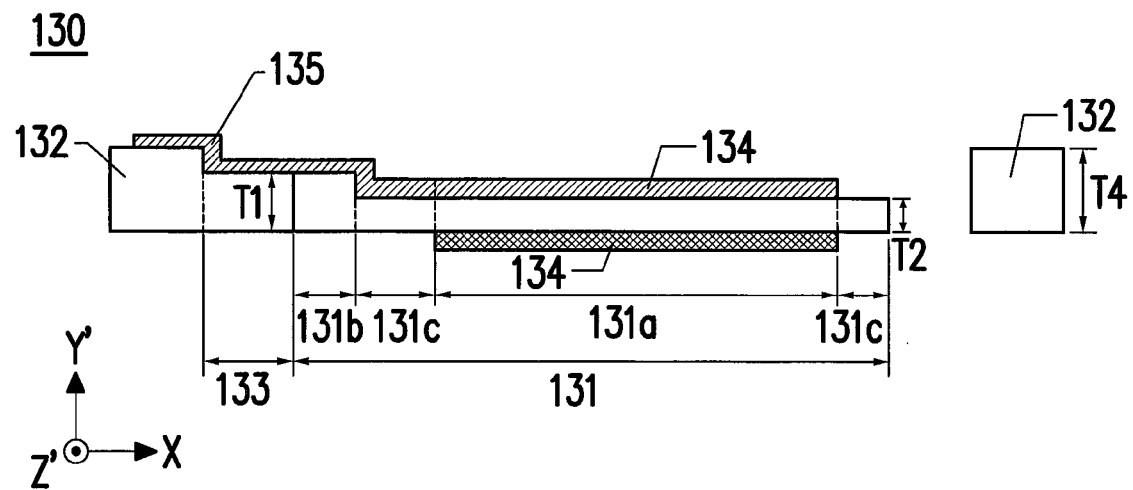
FIG. 3B is a cross-sectional view of the piezoelectric vibrating piece 130.

FIG. 3B is a cross-sectional view of the piezoelectric vibrating piece 130. FIG. 3B is a cross-sectional view taken along the line B-B of FIG. 2B. The piezoelectric vibrating piece 130 is formed to have a fourth thickness T4 as a thickness of the framing portion 132 in the Y' axis direction, a first thickness T1 as a thickness in the Y' axis direction of the connecting portion 133 and the second region 131b of the excitation unit 131, and a second thickness T2 as a thickness in the Y' axis direction of the first region 131a and the third region 131c of the excitation unit 131. The piezoelectric vibrating piece 130 is formed to have, for example, the fourth thickness T4 of 80 μm the first thickness T1 of 70 μm, and the second thickness T2 of 40 μm.

<Configuration of a Piezoelectric Vibrating Piece 230>

In the first region 131a of the piezoelectric vibrating piece, a mesa portion that is thicker in the Y' axis direction than the third region 131c may be formed. As a modification of the piezoelectric vibrating piece 130, a piezoelectric vibrating piece 230 including a mesa portion will be described below. Like reference numerals designate corresponding or identical elements to those of the piezoelectric vibrating piece 130, and therefore such elements will not be further elaborated here.

Figure 4A:
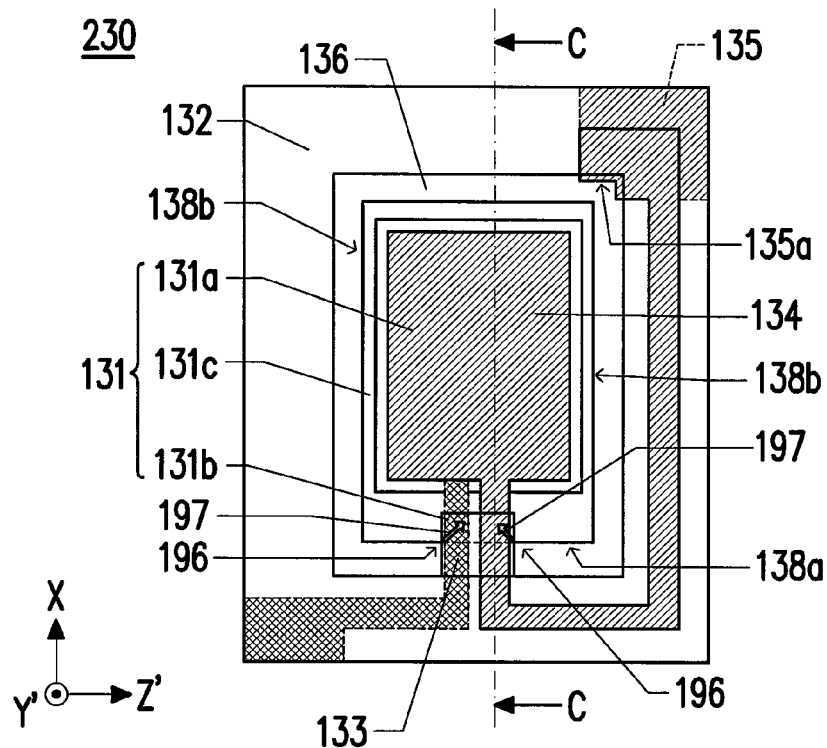
FIG. 4A is a plan view of a piezoelectric vibrating piece 230.

FIG. 4A is a plan view of the piezoelectric vibrating piece 230. The piezoelectric vibrating piece 230 is a mesa-type piezoelectric vibrating piece where the first region 131a of the excitation unit 131 is thicker than the third region 131c in the Y' axis direction. The mesa-type piezoelectric vibrating piece is capable to reduce flexure vibration, which is unnecessary vibration for thickness shear vibration of the excitation unit, and suppress degradation of properties such as crystal impedance (CI) value. Other configurations of the piezoelectric vibrating piece 230 are similar to those of the piezoelectric vibrating piece 130.

Figure 4B:
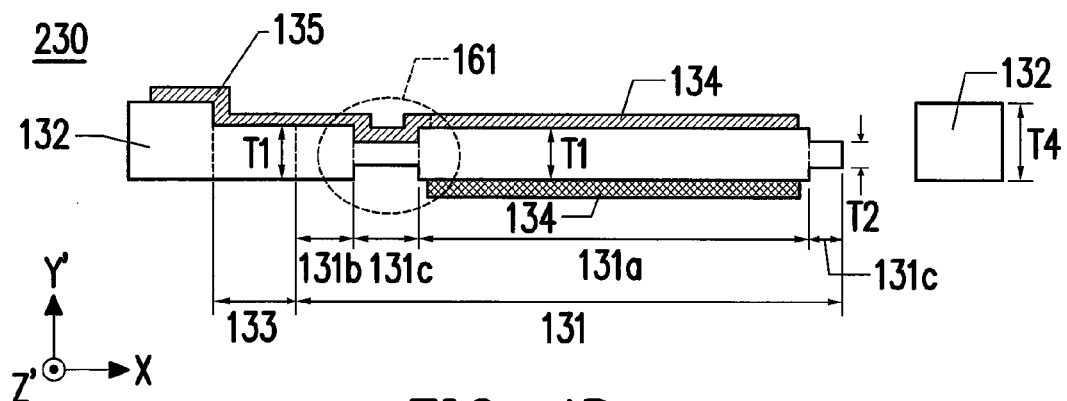
FIG. 4B is a cross-sectional view of the piezoelectric vibrating piece 230.

FIG. 4B is a cross-sectional view of the piezoelectric vibrating piece 230. FIG. 4B is a cross-sectional view taken along the line C-C of FIG. 4A. In the piezoelectric vibrating piece 230, the thickness in the Y' axis direction of the first region 131a, the thickness in the Y' axis direction of the connecting portion 133, and the thickness of the second region 131h are respectively formed to be the first thickness T1. The first thickness T1 is thicker than the second thickness T2, which is the thickness of the third region 131c in the Y' axis direction.

Figure 4C:
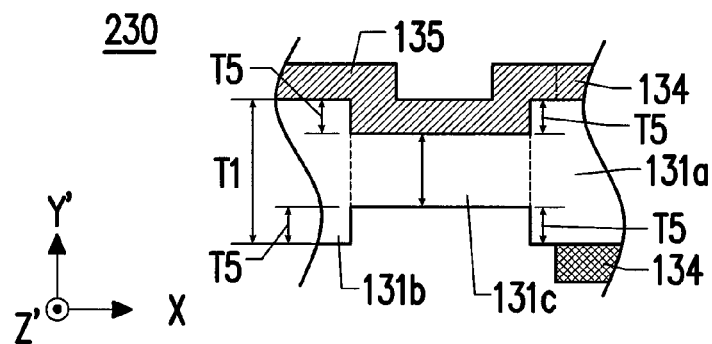
FIG. 4C is an enlarged partial cross-sectional view of the piezoelectric vibrating piece 230.

FIG. 4C is an enlarged partial cross-sectional view of the piezoelectric vibrating piece 230. FIG. 4C is an enlarged view of a frame 161 surrounded by a dotted line in FIG. 4B. In the piezoelectric vibrating piece 230, the second region 131b and the first region 131a are further formed to have a thickness T5 from the third region 131c in the +Y' axis direction and a thickness T5 from the third region 131c in the −Y' axis direction. That is, in the piezoelectric vibrating piece 230, the second region 131b and the first region 131a have the same thickness and are formed to have the same thickness from the third region 131c in the +Y' axis direction and the −Y' axis direction. Thus, in the manufacturing process of the piezoelectric vibrating piece 230, the structures of the connecting portion 133, the second region 131b, and the first region 131a are formed in one etching process at the same time. Accordingly, compared with the piezoelectric vibrating piece 130, in the piezoelectric vibrating piece 230, a mesa-type piezoelectric vibrating piece is manufactured such that the first region 131a is formed thicker than the third region 131c in the Y' axis direction without increasing processes.

<Simulation>

In the case where bending stress is applied to a printed circuit board on which the piezoelectric device is mounted, the bending stress is also applied to the piezoelectric device and the piezoelectric vibrating piece. The bending stress applied to a portion of the piezoelectric vibrating piece and its value can be calculated in simulation. It is confirmed that the simulation value is close to a value of the actually measured bending stress. A simulation result of bending stress on the piezoelectric vibrating piece in the case where bending stress is applied to a printed circuit board on which the piezoelectric device is mounted is described below. Like reference numerals designate corresponding or identical elements to those of the piezoelectric vibrating piece 130, and therefore such elements will not be further elaborated here.

FIG. 5A is a schematic cross-sectional view of a printed circuit board 200 and the piezoelectric device 100 mounted on the printed circuit board 200. The piezoelectric device 100 is mounted on the surface at the +Y' axis side of the printed circuit board 200. In the simulation, it is assumed that a force 170 in the +Y' axis direction is applied to the surface at the −Y' axis side of the printed circuit board 200 so as to generate bending stress at the printed circuit board 200. In the simulation, two cases are assumed. In one case, the bending stress bends the printed circuit board 200 in the X axis direction (X-axis bending in which the right direction in FIG. 5A is the +X axis direction). In the other case, the bending stress bends the printed circuit board 200 in the Z' axis direction (Z'-axis bending in which the right direction in FIG. 5A is the +Z' axis direction).

FIG. 5B is a schematic plan view of a piezoelectric vibrating piece 330a. In FIG. 5B, electrodes formed on the piezoelectric vibrating piece 330a are not illustrated, and external appearance is merely illustrated. The piezoelectric vibrating piece 330a includes an excitation unit 331, the framing portion 132, and a connecting portion 333a, which connects the excitation unit 331 and the framing portion 132 together. The excitation unit 331 includes the first region 131a, on which the excitation electrode is formed, and a peripheral region 331b, which surrounds the first region 131a. The first region 131a has the first thickness T1 in the Y' axis direction, and the peripheral region 331b has the second thickness T2 in the Y' axis direction. The second thickness T2 is thinner than the first thickness T1. The connecting portion 333a has the second thickness T2 in the Y' axis direction and a width L1a in the Z' axis direction. The connecting portion 333a connects the center of a side in the −X axis side of the excitation unit 331 and the framing portion 132 together.

FIG. 5C is a schematic cross-sectional view of a piezoelectric vibrating piece 330b. In FIG. 5C, electrodes formed on the piezoelectric vibrating piece 330b are not illustrated, and external appearance is merely illustrated. The piezoelectric vibrating piece 330b includes the excitation unit 331, the framing portion 132, a pair of connecting portions 333b, which connect the excitation unit 331 and the framing portion 132 together. In the piezoelectric vibrating piece 330b, the pair of the connecting portions 333b are respectively connected to the ends of the +Z' axis side and the −Z' axis side in a side at the −X axis side of the excitation unit 331. Each connecting portion 333b has a width L1b in the Z' axis direction.

Figure 6:
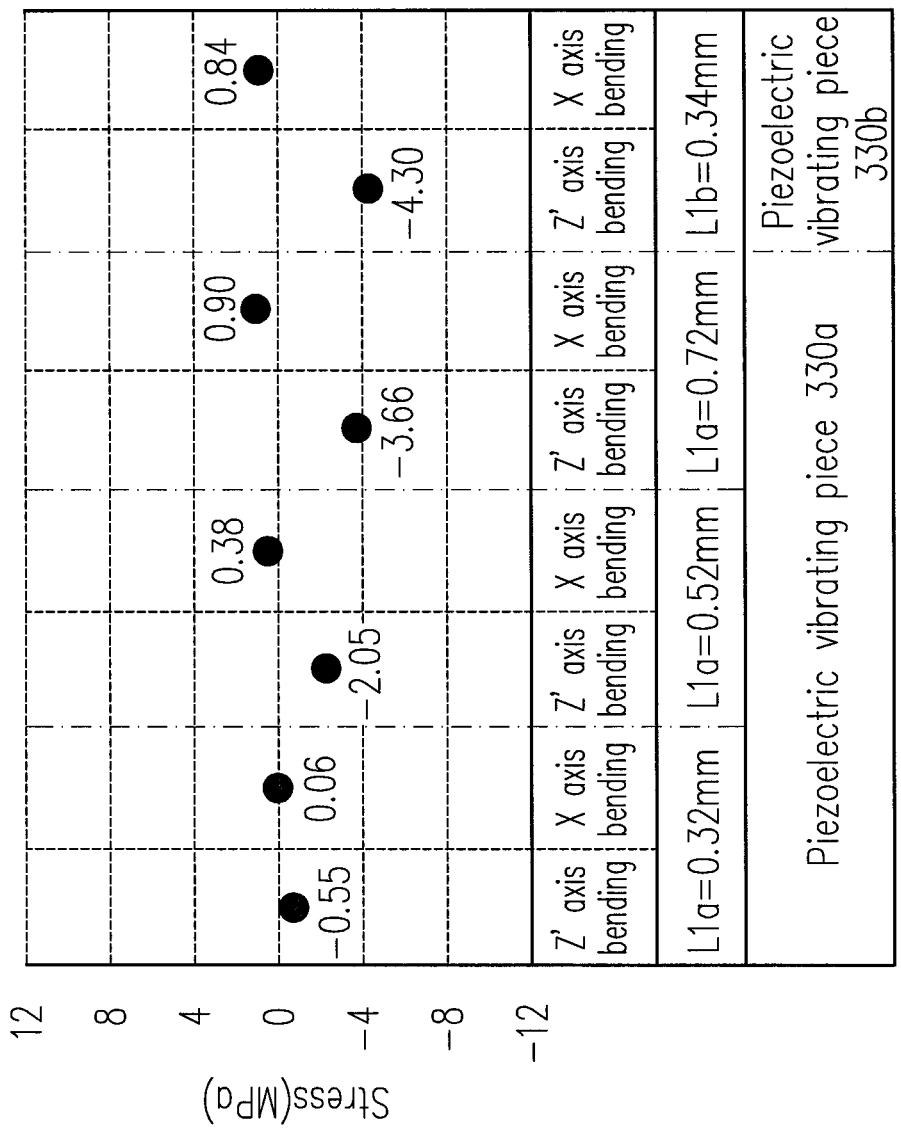

FIG. 6 is a graph showing stress on the center of the first region 131a. The vertical axis indicates stress applied on the center of the first region 131a in the excitation unit 331. Positive values indicate tensile stress, while negative values indicate compressive stress. The horizontal axis indicates respective cases of Z'-axis bendings and X-axis bendings, wherein the piezoelectric vibrating piece 330a includes the connecting portion 333a with the width L1a of 0.32 mm, 0.52 mm, and 0.72 mm, and the piezoelectric vibrating piece 330b includes the connecting portions 333b with the width L1b of 0.34 mm.

In the case where the width L1a of the piezoelectric vibrating piece 330a is 0.32 mm, a stress of −0.55 MPa is applied in the Z'-axis bending, and a stress of 0.06 MPa is applied in the X-axis bending. In the case where the width L1a of the piezoelectric vibrating piece 330a is 0.52 mm, a stress of −2.05 MPa is applied in the Z'-axis bending, and a stress of 0.38 MPa is applied in the X-axis bending. In the case where the width L1a of the piezoelectric vibrating piece 330a is 0.72 mm, a stress of −3.66 MPa is applied in the Z'-axis bending, and a stress of 0.90 MPa is applied in the X-axis bending. In the case where the width L1b of the piezoelectric vibrating piece 330b is 0.34 mm, a stress of −4.30 MPa is applied in the Z'-axis bending, and a stress of 0.84 MPa is applied in the X-axis bending.

The graph in FIG. 6 shows that the stress on the center of the first region 131a with one connecting portion is smaller than the stress with two connecting portions. In the case of one connecting portion, the thinner width L1a of the connecting portion provides the smaller stress on the center of the first region 131a of the excitation unit. Accordingly, the graph in FIG. 6 shows that the stress on the center of the first region 131a in the excitation unit is smaller with one connecting portion and with a thinner width of the connecting portion in the Z' axis direction than two connecting portions and with a thicker width thereof.

Figure 7A:
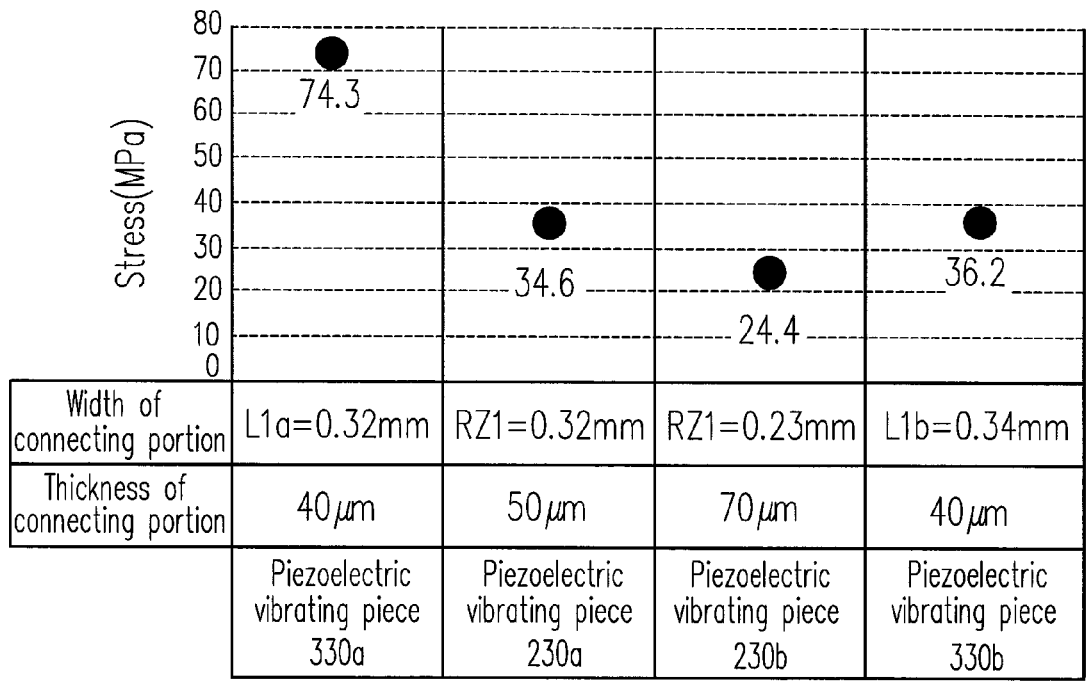
FIG. 7A is a graph showing the maximum stress applied to a connecting portion in the case where stress is applied to the piezoelectric vibrating piece.

FIG. 7A is a graph showing the maximum stress applied to the connecting portion in the case where stress is applied to the piezoelectric vibrating piece. FIG. 7A is a simulation result assuming that a stress of 3000 G is applied to a surface of the piezoelectric device at the +Y' axis side. In FIG. 7A, the vertical axis indicates the maximum stress applied to the connecting portion, while the horizontal axis indicates the piezoelectric vibrating piece 330a, a piezoelectric vibrating piece 230a, a piezoelectric vibrating piece 230b, and the piezoelectric vibrating piece 330b. In the piezoelectric vibrating piece 230 illustrated in FIG. 4B, the piezoelectric vibrating piece 230a and the piezoelectric vibrating piece 230b respectively have widths RZ1 of 0.32 mm and 0.23 mm in the connecting portion 133, while the connecting portion 133 and the second region 131b respectively have thicknesses of 50 μm and 70 μm in the Y' axis direction. Maximum stress of 74.3 MPa is applied to the connecting portion of the piezoelectric vibrating piece 330a. Maximum stress of 34.6 MPa is applied to the piezoelectric vibrating piece 230a. Maximum stress of 24.4 MPa is applied to the piezoelectric vibrating piece 230b. Maximum stress of 36.2 MPa is applied to the piezoelectric vibrating piece 330b.

Comparison between the piezoelectric vibrating piece 330a and the piezoelectric vibrating piece 230a reveals that an increase in thickness of the connecting portion decreases stress on the connecting portion. Although the piezoelectric vibrating piece 230a and the piezoelectric vibrating piece 230b are formed to have approximately the same cross-sectional area of the connecting portion in the Y'-Z' plane, the smaller stress is applied to the connecting portion of the piezoelectric vibrating piece 230b. It is assumed that the piezoelectric vibrating piece 230b has the connecting portion with larger thickness than that of the piezoelectric vibrating piece 230a. While the piezoelectric vibrating piece 330b has two connecting portions, the stress on the connecting portion is larger than that on the piezoelectric vibrating piece 230a and the piezoelectric vibrating piece 230b.

Figure 7B:
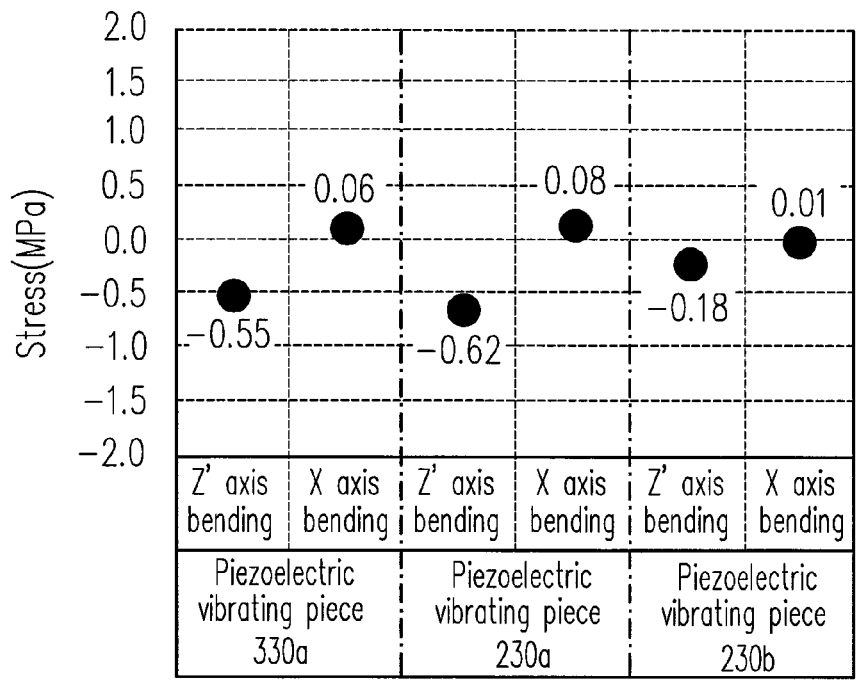
FIG. 7B is a graph showing stress applied to the center of the first region 131a in the excitation unit.

FIG. 7B is a graph showing stress applied to the center of the first region 131a in the excitation unit. FIG. 7B shows stresses on the piezoelectric vibrating piece 330a, the piezoelectric vibrating piece 230a, and the piezoelectric vibrating piece 230b. The result of the piezoelectric vibrating piece 230a is the same result shown in FIG. 6, which is plotted again for comparison. In the piezoelectric vibrating piece 230a and the piezoelectric vibrating piece 230b, values of stresses that are close to values of the piezoelectric vibrating piece 330a are calculated. The piezoelectric vibrating piece 230a and the piezoelectric vibrating piece 230b each undergo a small stress at the first region 131a, similarly to the piezoelectric vibrating piece 330a.

These results show that the piezoelectric vibrating piece with the connecting portion having a small width undergoes the small stress at the excitation unit (see FIG. 6). It is predicted that the connecting portion with a large thickness decreases the stress on the connecting portion, thus ensuring high impact resistance (see FIG. 7A). Further, it is confirmed that if the connecting portion increases in thickness and cross-sectional area, the stress on the excitation unit does not significantly change (see FIG. 7B). For example, although the piezoelectric vibrating piece 330a undergoes a small stress at the excitation unit (see FIG. 6), a large stress is applied to the connecting portion (see FIG. 7A). This causes low impact resistance. However, the piezoelectric vibrating piece 230a and the piezoelectric vibrating piece 230b each keep small stress at the connecting portion (FIG. 7A) and the first region 131a of the excitation unit (see FIG. 7B), which is preferred. That is, it is preferred that the connecting portion of the piezoelectric vibrating piece be formed to have a small width and a large thickness. Further, in the excitation unit, stress concentrates on the corner portions (for example, corner portions 196 in FIG. 4), which are constituted of the connecting portion 133 and the first side 138a. This likely causes damage by cracking from the corner portions. The cracking occurs in directions making the same angle from the side surface of the connecting portion 133 and from the first side 138a (in the directions indicated by white arrows 197 in FIG. 4A), which form the corner portions. In the piezoelectric vibrating piece 230a and the piezoelectric vibrating piece 230b, thicknesses in the Y' axis direction of the cracking directions at the corner portions are formed to be thick. This increases the strength of the corner portions. This reduces cracking from the corner portions, which are formed of the connecting portion 133 and the first side 138a, thus preventing damage on the excitation unit.

Second Embodiment

Steps at the excitation unit and the connecting portion of the piezoelectric vibrating piece may be formed in a taper surface. A piezoelectric vibrating piece 430a and a piezoelectric vibrating piece 430b that include taper surfaces is described below.

<Configuration of the Piezoelectric Vibrating Piece 430a>

Figure 8A:
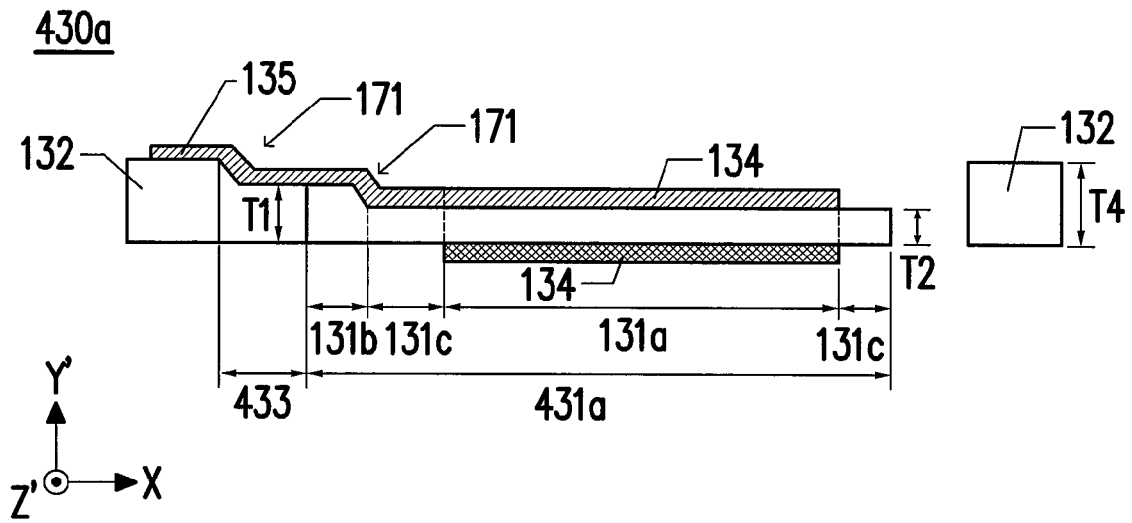
FIG. 8A is a cross-sectional view of a piezoelectric vibrating piece 430a according to a second embodiment.

FIG. 8A is a cross-sectional view of the piezoelectric vibrating piece 430a. The piezoelectric vibrating piece 430a includes an excitation unit 431a, the framing portion 132, and a connecting portion 433. The piezoelectric vibrating piece 430a has a shape where taper surfaces 171 are formed at a boundary of the second region 131b next to the third region 131c in the piezoelectric vibrating piece 130 (see FIG. 3B) and at a boundary of the connecting portion 433 next to the framing portion 132. The taper surfaces 171 are formed such that an angle between the +Y' axis direction and each direction normal to the taper surface 171 is less than 90 degrees. The extraction electrode 135 formed on the piezoelectric vibrating piece 430a is extracted from the excitation electrode 134 to the framing portion 132 via the taper surfaces 171.

<Configuration of the Piezoelectric Vibrating Piece 430b>

Figure 8B:
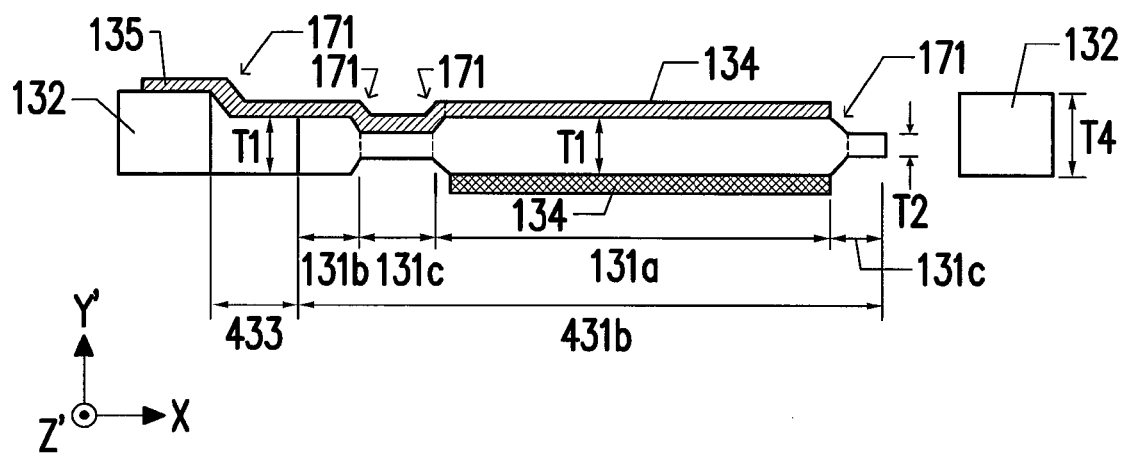
FIG. 8B is a cross-sectional view of a piezoelectric vibrating piece 430b.

FIG. 8B is a cross-sectional view of the piezoelectric vibrating piece 430b. The piezoelectric vibrating piece 430b includes an excitation unit 431b, the framing portion 132, and a connecting portion 433. The piezoelectric vibrating piece 430b includes taper surfaces 171 formed at a boundary of the first region 131a next to the third region 131c in the piezoelectric vibrating piece 230 (see FIG. 4B), at a boundary of the second region 131b next to the third region 131c, and at a boundary of the connecting portion 433 next to the framing portion 132. The extraction electrode 135 formed on the piezoelectric vibrating piece 430b is extracted from the excitation electrode 134 to the framing portion 132 via the taper surfaces 171.

The electrodes formed on the piezoelectric vibrating piece are formed by a method such as sputtering the electrodes in the +Y' axis direction or in the –Y' axis direction of the piezoelectric vibrating piece. At this time, in the case where the electrodes are formed on the piezoelectric vibrating piece with a step, thicknesses of the electrodes are reduced at the corner portion of the step. This increases electrical resistance of the electrodes. In the piezoelectric vibrating piece 430a and the piezoelectric vibrating piece 430b, the extraction electrode 135 is formed via the taper surfaces 171. This increases the thicknesses of the electrodes formed at the corner portion, thus preventing increase in electrical resistance of the electrodes.

Third Embodiment

In the connecting portion of the piezoelectric vibrating piece, an auxiliary connecting portion may be formed on the side surface of the connecting portion. A piezoelectric vibrating piece with the auxiliary connecting portion is described below.

<Configuration of a Piezoelectric Vibrating Piece 530a>

Figure 9A:
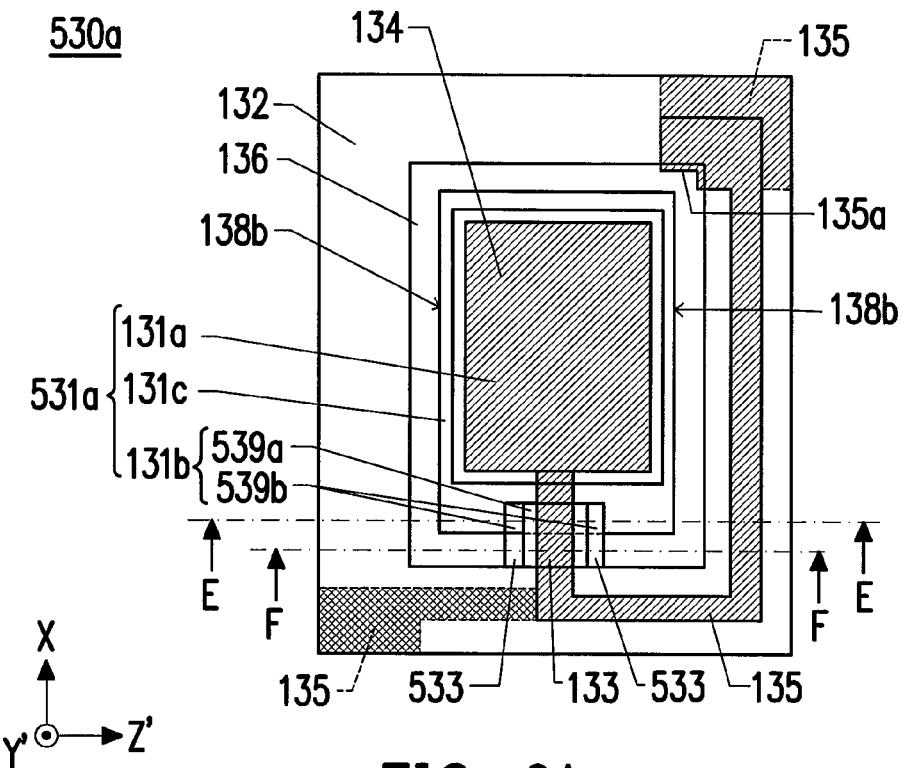
FIG. 9A is a plan view of a piezoelectric vibrating piece 530a according to a third embodiment.

FIG. 9A is a plan view of the piezoelectric vibrating piece 530a. The piezoelectric vibrating piece 530a includes an excitation unit 531a, the framing portion 132, the connecting portion 133, and first auxiliary connecting portions 533. The first auxiliary connecting portions 533 are formed on the side surfaces at the +Z' axis side and the –Z' axis side of the connecting portion 133. The second region 131b of the excitation unit 531a includes a first connecting region 539a and a second connecting region 539b. The first connecting region 539a is formed to have the same thickness as that of the connecting portion 133 in the Y' axis direction. The first connecting region 539a is directly connected to the connecting portion 133. The second connecting regions 539b are formed at the +Z' axis side and the –Z' axis side of the first connecting region 539a. The second connecting region 539b has the same thickness as that of the first auxiliary connecting portion 533 in the Y' axis direction. The second connecting regions 539b are directly connected to the first auxiliary connecting portion 533. Other configurations are similar to those of the piezoelectric vibrating piece 230 (see FIG. 4A).

Figure 9B:
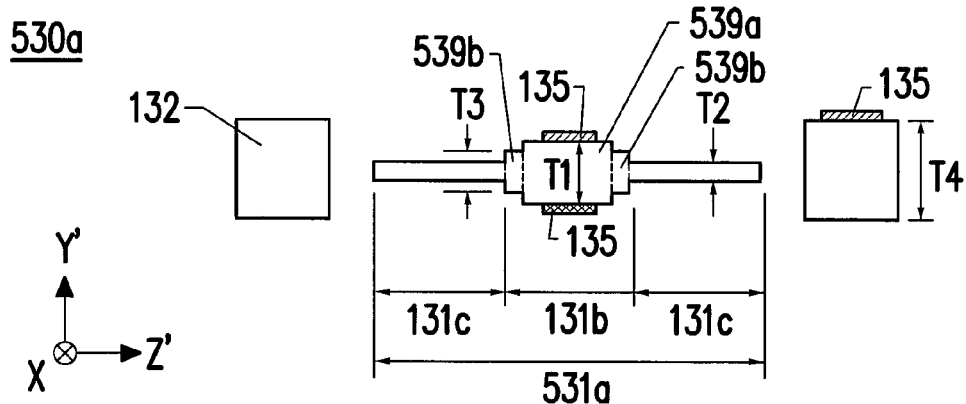

FIG. 9B is a cross-sectional view of the piezoelectric vibrating piece 530a. FIG. 9B is a cross-sectional view taken along the line E-E of FIG. 9A. In the piezoelectric vibrating piece 530a, the first connecting region 539a is formed to have a thickness in the Y' axis direction of a first thickness T1, while the second connecting region 539b is formed to have a thickness in the Y' axis direction of a third thickness T3. The third thickness T3 is thicker than the second thickness T2 of the third region 131c in the excitation unit 131, and thinner than the first thickness T1 of the first connecting region 539a.

Figure 9C:
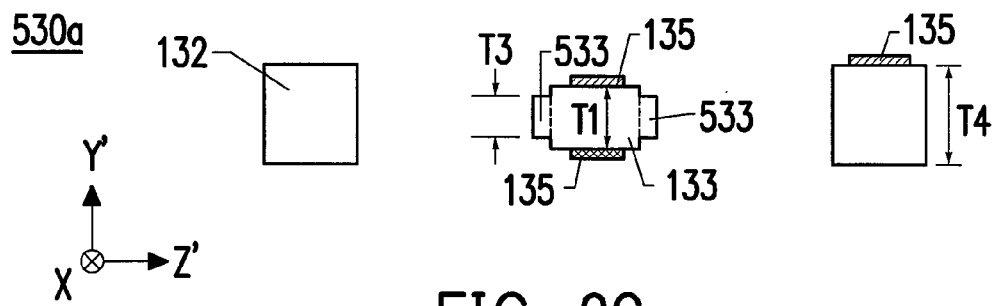

FIG. 9C is a cross-sectional view of the piezoelectric vibrating piece 530a. FIG. 9C is a cross-sectional view taken along the line F-F of FIG. 9A. The connecting portion 133 is formed to have the first thickness T1 in the Y' axis direction, while the first auxiliary connecting portion 533 is formed to have the third thickness T3 in the Y' axis direction. The connecting portion 133 with the first thickness T1 is directly connected to the first connecting region 539a, while the first auxiliary connecting portion 533 with the third thickness T3 is directly connected to the second connecting region 539b.

In the case where the piezoelectric vibrating piece is deeply etched in the Y' axis direction, the etched region of the piezoelectric vibrating piece may not be etched parallel to the etching direction. For example, in the piezoelectric vibrating piece 530a without the first auxiliary connecting portion 533, portions close to the center of the side surfaces in the Y' axis direction at the +Z' axis side and the –Z' axis side of the connecting portion 133 are possibly formed to be hollowed into the connecting portion 133 side. At this time, the hollowed portions of the connecting portion 133 are formed to be thin. This decreases strength of the connecting portion 133, thus reducing impact resistance of the piezoelectric vibrating piece. In the piezoelectric vibrating piece 530a, the first auxiliary connecting portion 533 is formed on the side surfaces at the +Z' axis side and the –Z' axis side of the connecting portion 133. Accordingly, the side surfaces at the +Z' axis side and the –Z' axis side of the connecting portion 133 are not largely hollowed into the connecting portion 133 side. The strength of the connecting portion 133 is maintained, thus preferably impact resistance of the piezoelectric vibrating piece is prevented from decreasing.

<Configuration of a Piezoelectric Vibrating Piece 530b>

Figure 10A:
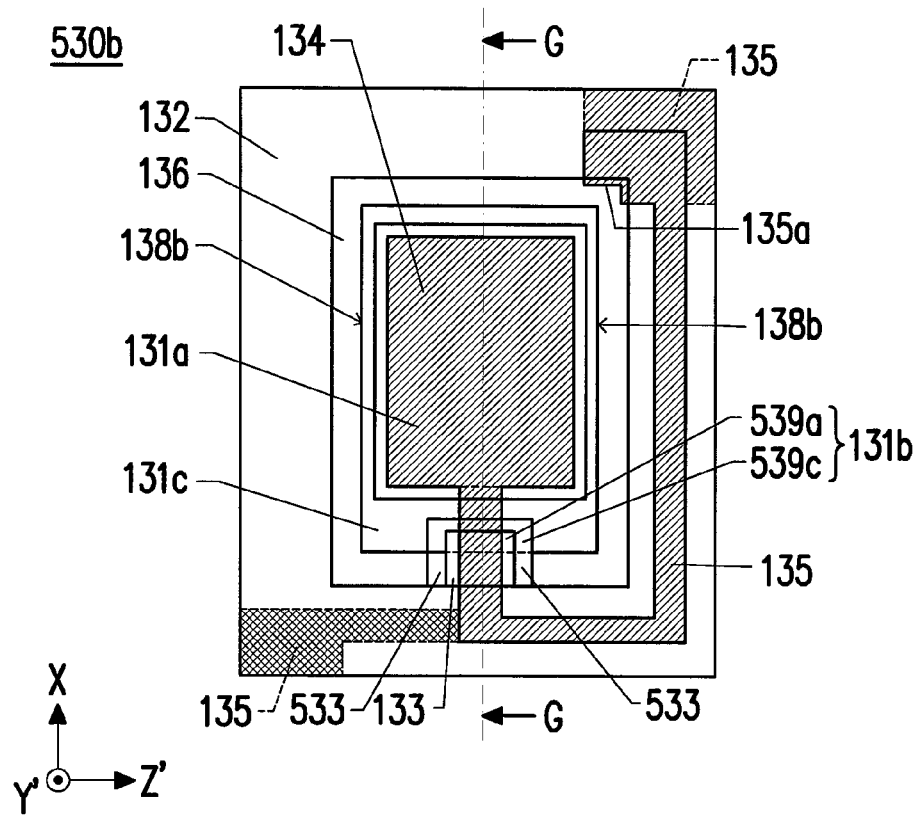
FIG. 10A is a plan view of a piezoelectric vibrating piece 530b.

FIG. 10A is a plan view of the piezoelectric vibrating piece 530b. The piezoelectric vibrating piece 530b includes an excitation unit 531b, the framing portion 132, the connecting portion 133, and the first auxiliary connecting portions 533. In the piezoelectric vibrating piece 530b, a first connecting region 539a and a third connecting region 539c are formed in the second region 131b. On the side surfaces at the +Z' axis side and the –Z' axis side of the connecting portion 133, the first auxiliary connecting portions 533 are formed. The first connecting region 539a is connected to the connecting portion 133, while the third connecting region 539c is connected to the first auxiliary connecting portions 533. The third connecting region 539c is formed in a peripheral area of the first connecting region 539a so as to separate the first connecting region 539a and the third region 131c. Other configurations are similar to those of the piezoelectric vibrating piece 230 (see FIG. 4A).

Figure 10B:
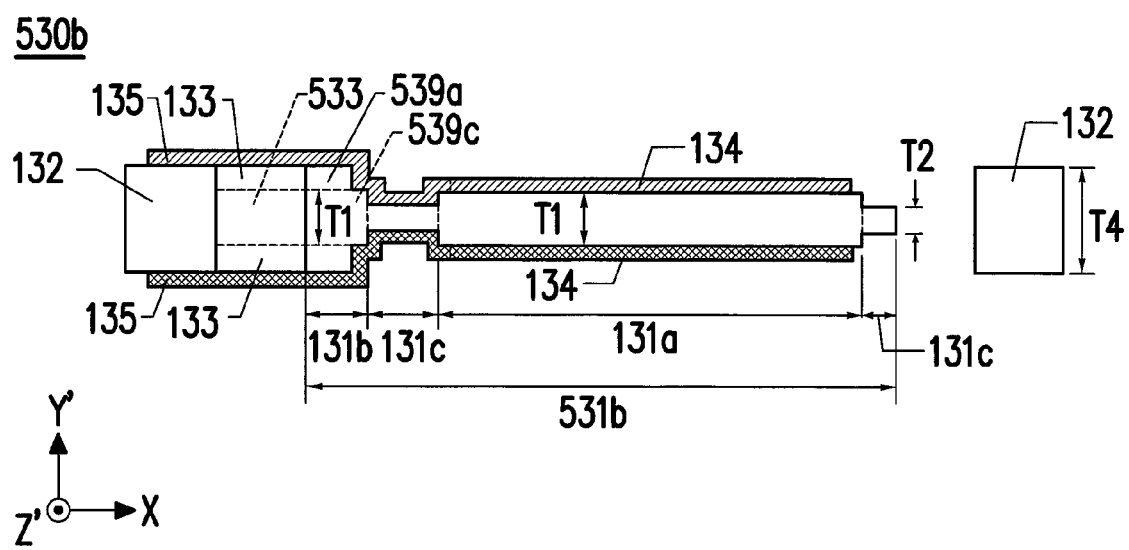
FIG. 10B is a cross-sectional view of the piezoelectric vibrating piece 530b.

FIG. 10B is a cross-sectional view of the piezoelectric vibrating piece 530b. FIG. 10B is a cross-sectional view taken along the line G-G of FIG. 10A. In the piezoelectric vibrating piece 530b, the connecting portion 133 and the first connecting region 539a are each formed to have a thickness in the Y' axis direction of the fourth thickness T4. The first auxiliary connecting portion 533, the third connecting region 539c, and the first region 131a are each formed to have a thickness in the Y' axis direction of the first thickness T1.

In the piezoelectric vibrating piece 530b, the first auxiliary connecting portion 533 is formed, similarly to the piezoelectric vibrating piece 530a. Thus, the side surfaces at the +Z' axis side and the −Z' axis side of the connecting portion 133 are not largely hollowed by etching. The first auxiliary connecting portion 533, the third connecting region 539c, and the first region 131a are formed to have the same thickness. Since the first auxiliary connecting portion 533, the third connecting region 539c, and the first region 131a can be formed in one etching process, the number of etching process can be reduced.

<Method for Manufacturing the Piezoelectric Vibrating Piece 530b>

Figure 12:
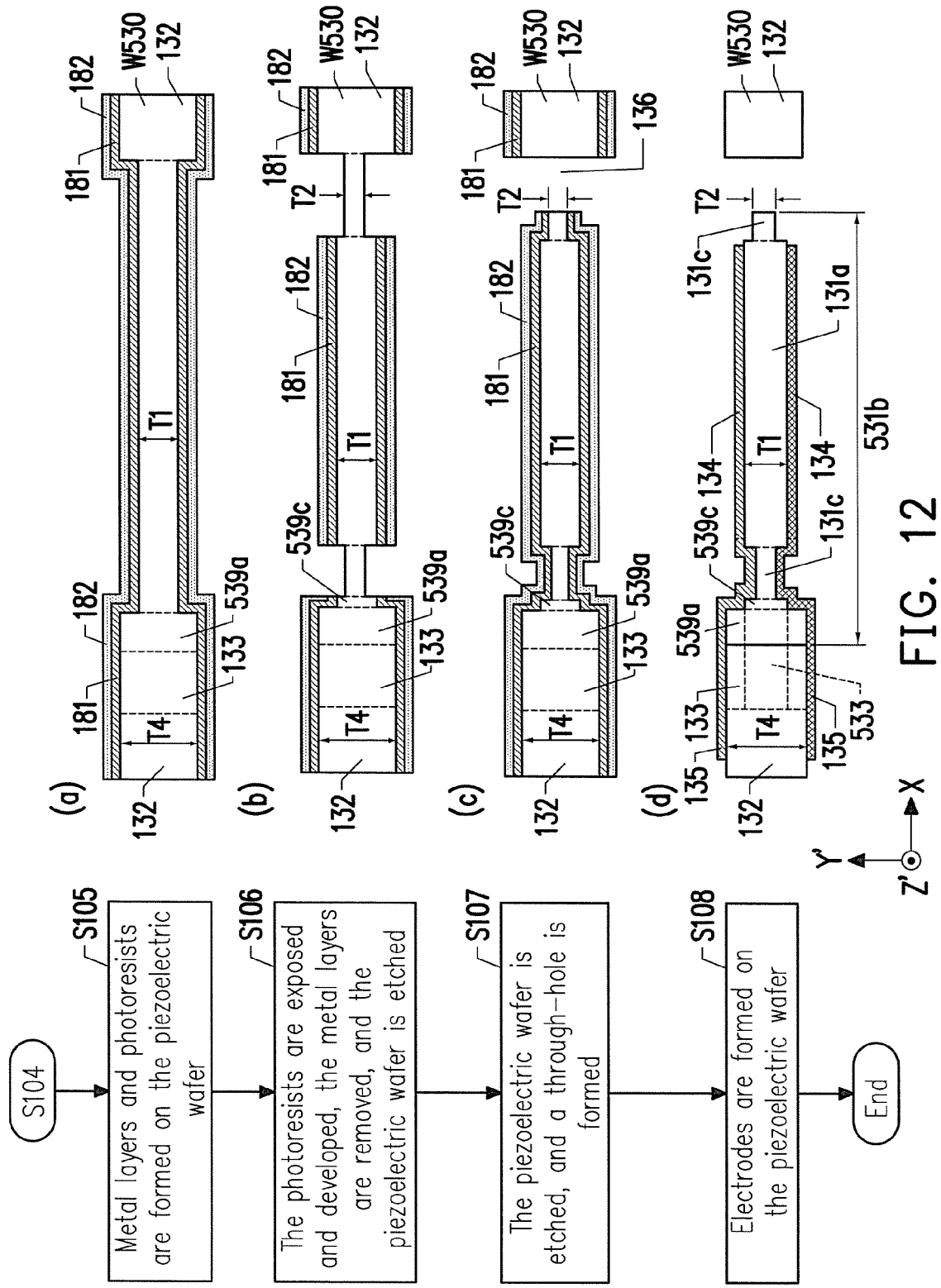
FIG. 12 includes both schematic diagram (right) and flow chart (left) of the rest of processes of the method for manufacturing the piezoelectric vibrating piece 530b in FIG. 11, wherein the schematic diagram includes four parts: (a), (b), (c) and (d), and each part corresponds to the steps of the flow chart of the manufacturing method.

A method for manufacturing the piezoelectric vibrating piece 530b is described by referring to FIG. 11 and FIG. 12. In the right side of FIG. 11 and FIG. 12, schematic diagrams to describe respective steps are illustrated. These diagrams are partial cross-sectional views of a piezoelectric wafer W530, which includes a plurality of piezoelectric vibrating pieces 530b, corresponding to cross-sectional surfaces of the piezoelectric vibrating piece 530b taken along the line G-G of FIG. 10A.

FIG. 11 includes both schematic diagram (right) and flow chart (left) of a method for manufacturing the piezoelectric vibrating piece 530b, wherein the schematic diagram includes four parts: (a), (b), (c) and (d), and each part corresponds to the steps of the flow chart of the manufacturing method. Namely, for the sake of convenience of description, the steps in the left side of FIG. 11 respectively correspond to the schematic diagrams of the right side of FIG. 11, wherein part (a) of FIG. 11 corresponds to step S101, part (b) corresponds to step S102, part (c) corresponds to step S103 and part (d) corresponds to step S104.

In step S101, the piezoelectric wafer W530 is prepared. Part (a) of FIG. 11 is a partial cross-sectional view of the piezoelectric wafer W530. The piezoelectric wafer W530, which is formed of a piezoelectric material, has planar surfaces at the +Y' axis side and the −Y' axis side. A plurality of piezoelectric vibrating pieces 530b are formed in the piezoelectric wafer W530. The piezoelectric wafer W530 is formed to have a thickness in the Y' axis direction of the fourth thickness T4.

In step S102, metal layers 181 and photoresists 182 are formed on the piezoelectric wafer W530. Part (b) of FIG. 11 is a partial cross-sectional view of the piezoelectric wafer W530 on which the metal layers 181 and the photoresists 182 are formed. In step S102, the metal layers 181 are formed on the surfaces at the +Y' axis side and the −Y' axis side of the piezoelectric wafer W530. The metal layers 181 are formed, for example, by forming a chromium (Cr) layer on the piezoelectric wafer W530 and evaporating a gold (Au) layer onto a surface of the chromium layer. Further, the photoresists 182 are formed on the surfaces of the metal layers 181.

In step S103, the photoresists 182 are exposed and developed, and the metal layers 181 are then removed. Part (c) of FIG. 11 is a partial cross-sectional view of the piezoelectric wafer W530 after the photoresists 182 are exposed and developed, and the metal layers 181 are removed. In step S103, the photoresists 182 are formed in regions at the +Y' axis side and the −Y' axis side of regions corresponding to the first region 131a, the third region 131c, the third connecting region 539c of the second region 131b, and the space 136 of the excitation unit 531b on the piezoelectric wafer W530, and the photoresists 182 are then exposed and developed. Further, the metal layers 181 formed on the region where the photoresists 182 are developed are removed.

In step S104, the piezoelectric wafer W530 is etched. Part (d) of FIG. 11 is a partial cross-sectional view of the piezoelectric wafer W530 after the etching in step S104. A region of the piezoelectric wafer W530 to be etched is a region where the photoresists 182 and the metal layers 181 are removed in step S103. Surfaces at the +Y' axis side and the −Y' axis side of the piezoelectric wafer W530 are etched. This ensures a thickness of the first thickness T1 in the etched region of the piezoelectric wafer W530. A region where the piezoelectric wafer W530 is not etched includes the framing portion 132, the connecting portion 133, and the first connecting region 539a of the second region. Thicknesses in the Y' axis direction of the region where these members are formed remains in the fourth thickness T4.

FIG. 12 includes both schematic diagram (right) and flow chart (left) of the rest of processes of the method for manufacturing the piezoelectric vibrating piece 530b in FIG. 11, wherein the schematic diagram includes four parts: (a), (b), (c) and (d), and each part corresponds to the steps of the flow chart of the manufacturing method. Namely, for the sake of convenience of description, the steps in the left side of FIG. 12 respectively correspond to the schematic diagrams of the right side of FIG. 12, wherein part (a) of FIG. 12 corresponds to step S105, part (b) corresponds to step S106, part (c) corresponds to step S107 and part (d) corresponds to step S108.

In step S105, the photoresists 182 and the metal layers 181 are formed on the piezoelectric wafer W530. Step S105 is performed after step S104 in FIG. 11. Part (a) of FIG. 12 is a partial cross-sectional view of the piezoelectric wafer W530 where the photoresists 182 and the metal layers 181 are formed. In step S105, the photoresists 182 and the metal layers 181, which were formed on the piezoelectric wafer W530, are all removed. Then, the metal layers 181 and the photoresists 182 are formed again on the surfaces of the piezoelectric wafer W530 at the +Y' axis side and the −Y' axis side.

In step S106, the photoresists 182 are exposed and developed, the metal layers 181 are removed, and the piezoelectric wafer W530 is then etched. Part (b) of FIG. 12 is a partial cross-sectional view of the etched piezoelectric wafer W530. In step S106, the photoresists 182, which are formed on the regions at the +Y' axis side and the −Y' axis side corresponding to the third region 131c of the excitation unit 531b and the space 136 in the piezoelectric wafer W530, are exposed and developed. Further, the metal layers 181, which are formed on the regions where the photoresists 182 are removed, are removed. Then, the piezoelectric wafer W530 is etched, and a thickness of the etched region on the piezoelectric wafer W530 is formed to be the second thickness T2.

In step S107, the piezoelectric wafer W530 is etched, and the space 136 is formed. Part (c) of FIG. 12 is a partial cross-sectional view of the piezoelectric wafer W530 where the space 136 is formed. In step S107, the photoresists 182 and the metal layers 181, which are formed on the piezoelectric wafer W530 after step S106, are all removed. Then, the metal layers 181 and the photoresists 182 are formed again on the surfaces at the +Y' axis side and the −Y' axis side of the piezoelectric wafer W530. Then, the photoresists 182, which are formed on the regions at the +Y' axis side and the −Y' axis side corresponding to the space 136 of the piezoelectric wafer W530, are exposed and developed. This removes the metal layers 181 formed in the developed region. Further, the piezoelectric wafer W530 is etched, and the etched region passes through the piezoelectric wafer W530 in the Y' axis direction. The region that passes through the piezoelectric wafer W530 in the Y' axis direction forms the space 136.

In step S108, electrodes are formed on the piezoelectric wafer W530. Part (d) of FIG. 12 is a partial cross-sectional view of the piezoelectric wafer W530 on which the electrodes are formed. In step S108, the photoresists 182 and the metal layers 181, which are formed on the piezoelectric wafer W530 after step S107, are all removed. Then, the excitation electrodes 134 and the extraction electrodes 135 are formed on the piezoelectric wafer W530.

As described above, the plurality of piezoelectric vibrating pieces 530b are formed in the piezoelectric wafer W530. After step S108, the piezoelectric wafer W530 are bonded to the lid wafer (not shown), which includes a plurality of lid plates 110, and the base wafer (not shown), which includes a plurality of base plates 120, via the sealing material 141 (see FIG. 2A). Then, the piezoelectric device is formed by dicing the bonded wafer into the piezoelectric devices.

In the process for manufacturing the piezoelectric vibrating piece 530b illustrated in FIG. 11 and FIG. 12, the piezoelectric wafer W530 is etched in step S104, step S106, and step S107. In the piezoelectric vibrating piece 530b, the third connecting region 539c, the first region 131a, and the first auxiliary connecting portion 533 are formed to have the same thickness. Accordingly, as illustrated in step S106, one etching process is able to form the third connecting region 539c, the first region 131a, and the first auxiliary connecting portion 533. This preferably reduces etching processes.

Fourth Embodiment

In a piezoelectric vibrating piece, stress often concentrates at the corner portions, thus it may easily cause damage initially at the corner portions. A piezoelectric vibrating piece that prevents this damage is described below.

<Configurations of a Piezoelectric Vibrating Piece 630a and a Piezoelectric Vibrating Piece 630b>

The piezoelectric vibrating piece may have the second region with a larger width in the Z' axis direction than the width in the Z' axis direction of the connecting portion. The piezoelectric vibrating piece 630a with the second region having a larger width in the Z' axis direction than a width in the Z' axis direction of the connecting portion is described below.

FIG. 13A is a plan view of the piezoelectric vibrating piece 630a. The piezoelectric vibrating piece 630a includes an excitation unit 631a, the framing portion 132, and the connecting portion 133. The excitation unit 631a includes the second region 131b with a width in the Z' axis direction of a width LZ2, while the second region 131b includes the first side 138a with a width of the width LZ2. The width LZ2 is formed to be larger than the length RZ1 in the Z' axis direction of the connecting portion 133. Thus, corner portions 191, which are formed of the connecting portion 133 and the excitation unit 631a, are formed to be surrounded by the connecting portion 133 and the second region 131b, which are formed to have the first thickness T1. Other configurations are similar to those of the piezoelectric vibrating piece 130 (see FIG. 2B).

FIG. 13B is a partial plan view of the piezoelectric vibrating piece 630b. FIG. 13B illustrates the half plan view of the piezoelectric vibrating piece 630b at the −X axis side. The piezoelectric vibrating piece 630b includes an excitation unit 631b, the framing portion 132, and the connecting portion 133. The excitation unit 631b includes the second region 131b with a width in the Z' axis direction of the width LZ1, which is the same width as the width in the Z' axis direction of the excitation unit 631b. Thus, corner portions 192, which are formed of the connecting portion 133 and the excitation unit 631b, are formed to be surrounded by the connecting portion 133 and the second region 131b, which are formed to have the first thickness T1. Other configurations are similar to those of the piezoelectric vibrating piece 130 (see FIG. 2B).

FIG. 13C is a partial plan view of the piezoelectric vibrating piece 630c. FIG. 13C illustrates the half plan view of the piezoelectric vibrating piece 630c at the −X axis side. The piezoelectric vibrating piece 630c includes an excitation unit 631c, the framing portion 132, the connecting portion 133, and the first auxiliary connecting portion 533. In the piezoelectric vibrating piece 630c, the first connecting region 539a and a third connecting region 639e are formed in the second region 131b of the excitation unit 631c. On side surfaces at the +Z' axis side and the −Z' axis side of the connecting portion 133, the first auxiliary connecting portions 533 are formed. The first connecting region 539a is connected to the connecting portion 133, while the third connecting region 639c is connected to the first auxiliary connecting portions 533. The third connecting region 639c is formed in the peripheral area of the first connecting region 539a so as to separate the first connecting region 539a and the third region 131c. The excitation unit 631c includes the second region 131b with a width in the Z' axis direction of the width LZ3, while the second region 131b includes the first side 138a with a width of the width LZ3. The width LZ3 is formed to be larger than a width RZ2, which includes the widths in the Z' axis direction of the connecting portion 133 and the first auxiliary connecting portion 533. Thus, corner portions 193, which are formed of the first auxiliary connecting portion 533 and the excitation unit 631c, are formed to be surrounded by the first auxiliary connecting portion 533 and the third connecting region 639c, which are formed to have the first thickness T1. Other configurations are similar to those of the piezoelectric vibrating piece 530b (see FIG. 10A).

In the piezoelectric vibrating piece, stress is easily applied to the corner portions, which are formed of the connecting portion and the excitation unit. Crack initiation is likely to occur from the corner portions in the piezoelectric vibrating piece. In the piezoelectric vibrating piece 630a, the piezoelectric vibrating piece 630b, and the piezoelectric vibrating piece 630c, the corner portions 191, the corner portions 192, and the corner portions 193 are formed to be thick in the Y' axis direction. Since strengths of the corner portions are increased, crackings from initiating at the corner portions 191, the corner portions 192, and the corner portions 193 can be prevented.

<Configurations of a Piezoelectric Vibrating Piece 730a, a Piezoelectric Vibrating Piece 730b, and a Piezoelectric Vibrating Piece 730c>

The piezoelectric vibrating piece may have the second region with corner portions that are chamfered to have curved surfaces or planar surfaces. A piezoelectric vibrating piece where corner portions of the second region are chamfered is described below.

FIG. 14A is a plan view of the piezoelectric vibrating piece 730a. The piezoelectric vibrating piece 730a includes an excitation unit 731a, the framing portion 132, and the connecting portion 133. In the piezoelectric vibrating piece 730a, the excitation unit 731a includes the second region 131b with corner portions on the side surface at the excitation electrode 134 side. The corner portions are chamfered by cutting off to have planar surfaces 739a. Other configurations are similar to those of the piezoelectric vibrating piece 130 (see FIG. 2B).

FIG. 14B is a partial plan view of a piezoelectric vibrating piece 730b. FIG. 4B illustrates the half plan view of the piezoelectric vibrating piece 730b at the −X axis side. In the piezoelectric vibrating piece 730b, the second region 131b includes a side surface at the excitation electrode 134 side. This side surface is formed to have a curved surface 739b, which has a partial circular shape in a plan view. Thus, the second region 131b does not include any corner portion. Other configurations of the piezoelectric vibrating piece 730b are similar to those of the piezoelectric vibrating piece 130 (see FIG. 2B).

FIG. 14C is a partial plan view of a piezoelectric vibrating piece 730c. FIG. 4C illustrates the half plan view of the piezoelectric vibrating piece 730c at the −X axis side. In the piezoelectric vibrating piece 730c, the second region 131b includes a side surface that is formed to have a curved surface 739c at the excitation electrode 134 side. The curved surface 739c has a shape including a two-mountain shape in the +X axis direction in a plan view, and the second region 131b does not include any corner portion. Other configurations of the piezoelectric vibrating piece 730c are similar to those of the piezoelectric vibrating piece 130 (see FIG. 2B).

In the piezoelectric vibrating piece 730a, the piezoelectric vibrating piece 730b, and the piezoelectric vibrating piece 730c, a corner portion with an angle equal to or less than 90 degrees is not formed in the second region of the excitation unit. There is no portion on which stress concentrates in the second region 131b, thus damage on the piezoelectric vibrating piece due to a corner portion of the second region 131b is prevented.

<Configurations of a Piezoelectric Vibrating Piece 830a, a Piezoelectric Vibrating Piece 830b, and a Piezoelectric Vibrating Piece 830c>

A second auxiliary connecting portion may be formed on a corner portion between the connecting portion and the first side of the excitation unit. A piezoelectric vibrating with the second auxiliary connecting portion piece will be described below.

Figure 15A:
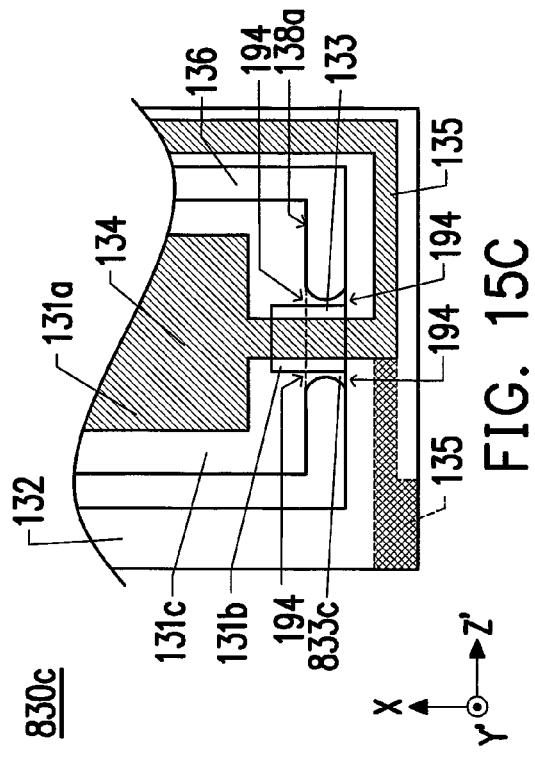

FIG. 15A is a partial plan view of a piezoelectric vibrating piece 830a. FIG. 15A illustrates the half plan view of the piezoelectric vibrating piece 830a at the −X axis side. The piezoelectric vibrating piece 830a includes the excitation unit 131, the framing portion 132, the connecting portion 133, and the second auxiliary connecting portions 833a. The second auxiliary connecting portions 833a are formed at the +Z' axis side and the −Z' axis side in the connecting portion 133. The second auxiliary connecting portions 833a have a thickness in the Y' axis direction of the second thickness T2 (see FIG. 3B), which is the same as that of the third region 131c. The second auxiliary connecting portion 833a is formed to include corner portions 194, which are formed between the connecting portion 133 and the excitation unit 131 and between the connecting portion 133 and the framing portion 132. Other configurations are similar to those of the piezoelectric vibrating piece 130 (see FIG. 2B).

Figure 15B:
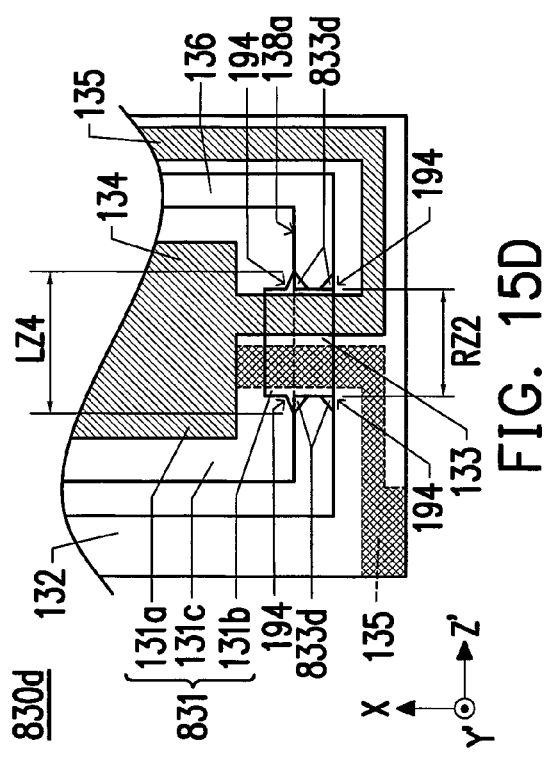
FIG. 15B is a partial plan view of a piezoelectric vibrating piece 830b.

FIG. 15B is a partial plan view of the piezoelectric vibrating piece 830b. FIG. 15B illustrates the half plan view of the piezoelectric vibrating piece 830b at the −X axis side. The piezoelectric vibrating piece 830b also has, similarly to the piezoelectric vibrating piece 830a, a shape where the second auxiliary connecting portions 833b are formed in the piezoelectric vibrating piece 130. The second auxiliary connecting portions 833b, which are formed in the piezoelectric vibrating piece 830b, are formed to have the second thickness T2. The second auxiliary connecting portions 833b are formed at corner portions 194 formed between the connecting portion 133 and the excitation unit 131 and between the connecting portion 133 and the framing portion 132. The second auxiliary connecting portions 833b are each formed to have a triangular shape in a plan view in the X-Z' plane. The triangular shape has two sides at side surfaces of the first side 138a and the connecting portion 133 and another side in a straight line, which is not parallel to the X axis direction or the Z' axis direction. Thus, as illustrated in FIG. 15B, a corner portion with an angle equal to or less than 90 degrees is not formed between the connecting portion 133 and the first side 138a and between the connecting portion 133 and the framing portion 132.

Figure 15C:
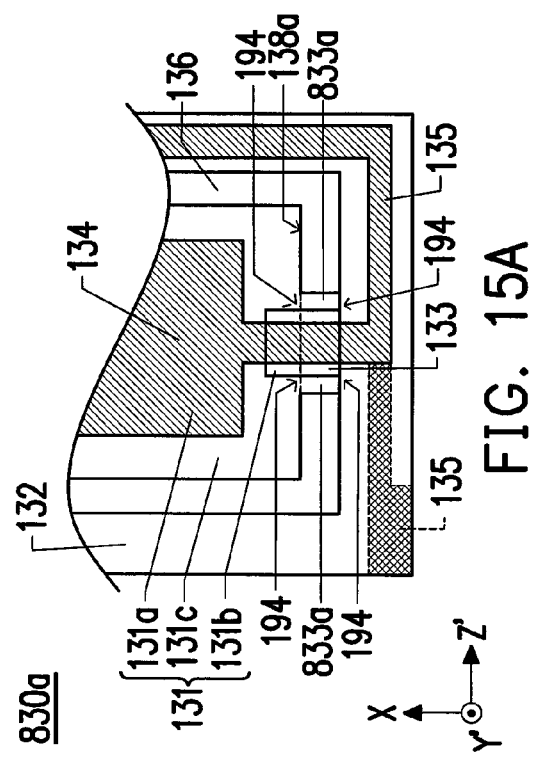
FIG. 15C is a partial plan view of a piezoelectric vibrating piece 830c.

FIG. 15C is a partial plan view of the piezoelectric vibrating piece 830c. FIG. 15C illustrates the half plan view of the piezoelectric vibrating piece 830c at the −X axis side. The piezoelectric vibrating piece 830c also has, similarly to the piezoelectric vibrating piece 830a, a shape where the second auxiliary connecting portions are formed in the piezoelectric vibrating piece 130. The second auxiliary connecting portions 833c, which is formed in the piezoelectric vibrating piece 830c, are formed to have the second thickness T2. The second auxiliary connecting portions 833c are formed on the side surfaces at the +Z' axis side and the −Z' axis side of the connecting portion 133. The second auxiliary connecting portion 833c has a curved surface at the opposite side of the connecting portion 133. The curved surface is recessed toward the connecting portion 133 side. Thus, the corner portions 194 between the second auxiliary connecting portions 833c and the first side 138a and between the second auxiliary connecting portions 833c and the framing portion 132 are not formed to have angles equal to or less than 90 degrees.

Figure 15D:
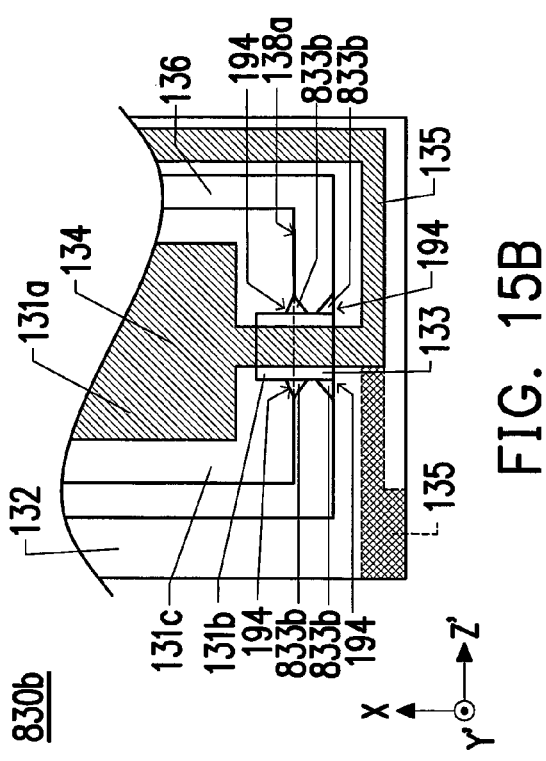
FIG. 15D is a partial plan view of a piezoelectric vibrating piece 830d.

FIG. 15D is a partial plan view of a piezoelectric vibrating piece 830d. FIG. 15D illustrates the half plan view of the piezoelectric vibrating piece 830d at the −X axis side. The piezoelectric vibrating piece 830d includes an excitation unit 831, the framing portion 132, the connecting portion 133, and second auxiliary connecting portions 833d. The second auxiliary connecting portions 833d are formed to have the same thickness of the first thickness T1 as those of the connecting portion 133 and the second region 131b. The second auxiliary connecting portions 833d are formed at the corner portions 194, which are formed between the connecting portion 133 and the excitation unit 831 and between the connecting portion 133 and the framing portion 132. The second auxiliary connecting portions 833d are each formed to have a triangular shape in a plan view in the X-Z' plane. The triangular shape has two sides at side surfaces of the first side 138a and the connecting portion 133 and another side in a straight line, which is not parallel to the X axis direction or the Z' axis direction. Thus, as illustrated in FIG. 15D, a corner portion with an angle equal to or less than 90 degrees is not formed between the connecting portion 133 and the first side 138a and between the connecting portion 133 and the framing portion 132. The excitation unit 831 includes the second region 131b with a width in the Z' axis direction of a width LZ4. The width LZ4 is formed to be larger than a width RZ2, which is the width of the connecting portion 133 in the Z' axis direction. The second region 131b is formed to have the width LZ4 in the first side 138a. The second region 131b with the first thickness T1 is directly connected to the connecting portion 133 and the +X axis side of the second auxiliary connecting portion 833d. In the piezoelectric vibrating piece 830d illustrated in FIG. 15D, the second auxiliary connecting portion may have a shape with a curved surface in a plan view, which is recessed toward the connecting portion 133 side, similarly to the second auxiliary connecting portions 833c illustrated in FIG. 15C.

In the piezoelectric vibrating piece 830a, the corner portions 194 between the connecting portion 133 and the first side 138a and between the connecting portion 133 and the framing portion 132 are reinforced by the second auxiliary connecting portions 833a. In the piezoelectric vibrating piece 830b and the piezoelectric vibrating piece 830c, the corner portions 194 between the connecting portion 133 and the first side 138a and between the connecting portion 133 and the framing portion 132 are respectively reinforced by the second auxiliary connecting portions 833b and the second auxiliary connecting portions 833c. In this case, the corner portions between the first side 138a and the connecting portion 133 are not formed to have angles equal to or less than 90 degrees, thus crackings from initiating at the corner portions 194 between the first side 138a and the connecting portion 133 are prevented.

<Configurations of a Piezoelectric Vibrating Piece 930a and a Piezoelectric Vibrating Piece 930b>

In the piezoelectric vibrating piece, corner portions are also formed in the framing portion. As illustrated in FIGS. 15B and 15C, the corner portion with an angle larger than 90 degrees prevents, for example, cracking from initiating at the corner portions. Accordingly, the framing portion may have an auxiliary frame portion to reinforce the corner portion in the framing portion. A piezoelectric vibrating piece with the auxiliary frame portion in the corner portion of the framing portion is described below.

FIG. 16A is a plan view of a piezoelectric vibrating piece 930a. The piezoelectric vibrating piece 930a includes the excitation unit 131, the framing portion 132, the connecting portion 133, and auxiliary frame portions 932a. The auxiliary frame portions 932a are formed at the respective four corners on side surfaces, which face the excitation unit 131 of the framing portion 132. The auxiliary frame portions 932a are each formed to have a triangular shape in a plan view in the X-Z' plane. The triangular shape has two sides that are shared with the side surfaces of the framing portion 132 and another side in a straight line, which is not parallel to the X axis direction or the Z' axis direction. Thus, the auxiliary frame portions 932a prevent corner portions 195, which are at the four corners of the side surfaces at the excitation unit 131 side of the framing portion 132, from having an angle equal to or less than 90 degrees.

FIG. 16B is a plan view of a piezoelectric vibrating piece 930b. The piezoelectric vibrating piece 930b includes the excitation unit 131, the framing portion 132, the connecting portion 133, and auxiliary frame portions 932b. The auxiliary frame portions 932b are formed in the respective four corners on the side surfaces, which face the excitation unit 131 of the framing portion 132. The respective auxiliary frame portions 932b are each formed to have a shape surrounded by the two sides that are shared with the side surfaces of the framing portion 132 and a curved line, which is recessed toward the corner portions 195 side in a plan view in the X-Z' plane. The piezoelectric vibrating piece 930b also prevents, similarly to the piezoelectric vibrating piece 930a, the corner portions 195, which are at the four corners of the side surfaces at the excitation unit 131 side of the framing portion 132, from having angles equal to or less than 90 degrees.

In the piezoelectric vibrating piece 930a and the piezoelectric vibrating piece 930b, the auxiliary frame portions are formed at the corner portions 195 of the framing portion 132. This reduces cracking that initiates at the corner portions 195 of the framing portion 132, thus improving impact resistance. The auxiliary frame portions are formed to have the same thickness as that of one of the framing portion 132, the connecting portion 133, and the third region 131c. This preferably reduces the number of etching processes in the manufacturing process of the piezoelectric vibrating piece.

Representative embodiments have been described in detail above. As evident to those skilled in the art, the present invention may be changed or modified in various ways within the technical scope of the invention.

For example, while the first side is shorter than the second side in the embodiments, the first side may be longer than the second side. While in the base plate 120 described in the embodiments the castellations 126 in cylindrical shapes are formed in the four corners of the base plate 120, this should not be construed in a limiting sense. The base plate may have a castellation with a shape that extends in the short side direction from the corner portions of the base plate, or a castellation with a shape that does not include the four corners of the base plate at the short side of the base plate.

While in the embodiments the piezoelectric vibrating piece is an AT-cut quartz-crystal vibrating piece, for example, a BT-cut quartz-crystal vibrating piece, which vibrates in a thickness-shear vibration mode similarly to the AT-cut quartz-crystal vibrating piece, may be applicable. Further, the piezoelectric vibrating piece is basically applied to piezoelectric material including not only quartz-crystal material but also lithium tantalite, lithium niobate, and piezoelectric ceramic.

What is claimed is:

1. A piezoelectric vibrating piece comprising:
an excitation unit in a rectangular shape including a first side and a second side, the first side extending in a first direction, the second side extending in a second direction perpendicular to the first direction;
a framing portion that surrounds the excitation unit and has a space; and
a connecting portion that connects the first side of the excitation unit and the framing portion, the connecting portion having a first thickness in a third direction perpendicular to the first direction and the second direction, wherein the excitation unit includes a first region, a second region, and a third region, a pair of excitation electrodes are disposed on two main surfaces of the first region, the second region includes at least a part of the first side, the second region with the first thickness being directly connected to the connecting portion, the third region is disposed between the first region and the second region, the third region is a region other than the first region and the second region, the third region has a second thickness in the third direction, and a thickness of the second region in the third direction is thicker than the second thickness, wherein the space of the framing portion is located at regions other than the connecting portion between the excitation unit and the framing portion.

2. The piezoelectric vibrating piece according to claim 1, wherein the first side has a length shorter than a length of the second side.

3. The piezoelectric vibrating piece according to claim 1, wherein the connecting portion is connected to a center of the first side.

4. The piezoelectric vibrating piece according to claim 1, wherein a thickness of the first region in the third direction is thicker than the second thickness.

5. The piezoelectric vibrating piece according to claim 4, wherein the first region is connected to the third region by a first taper surface, the first taper surface having a predetermined angle with respect to the third direction.

6. The piezoelectric vibrating piece according to claim 1, wherein the second region is connected to the third region by a second taper surface, the second taper surface having a predetermined angle with respect to the third direction.

7. The piezoelectric vibrating piece according to claim 1, further comprising:
a first auxiliary connecting portion disposed on a side surface in the first direction of the connecting portion, the first auxiliary connecting portion having a third thickness, wherein the third thickness is thinner than the first thickness and thicker than the second thickness, the second region of the excitation unit includes a first connecting region having the first thickness and directly connected to the connecting portion, and a second connecting region having the third thickness and connected to the first auxiliary connecting portion.

8. The piezoelectric vibrating piece according to claim 7, wherein the second connecting region is entirely disposed in a region between the first connecting region and the third region.

9. The piezoelectric vibrating piece according to claim 4, wherein the thickness of the first region in the third direction is the first thickness.

10. The piezoelectric vibrating piece according to claim 7, wherein the thickness of the first region in the third direction is the third thickness.

11. The piezoelectric vibrating piece according to claim 1, further comprising:
a second auxiliary connecting portion disposed on a side surface in the first direction of the connecting portion, the second auxiliary connecting portion having the second thickness.

12. The piezoelectric vibrating piece according to claim 11, wherein the second auxiliary connecting portion connects the side surface in the first direction of the connecting portion to the first side and the framing portion with one of a curved surface and a planar surface, wherein the planar surface has a normal line, and the normal line is inclined from the first direction to the second direction by a predetermined angle.

13. The piezoelectric vibrating piece according to claim 1, wherein a corner portion on a side surface at the excitation electrode side of the second region is chamfered to have a curved surface or a planar surface.

14. The piezoelectric vibrating piece according to claim 1, wherein the connecting portion has a first width in the first direction, the second region has a second width in the first direction, the second region includes the first side with the second width, and the first width is smaller than the second width.

15. The piezoelectric vibrating piece according to claim 1, further comprising:
auxiliary frame portions respectively disposed at four corners on side surfaces at the excitation unit side of the framing portion, wherein the auxiliary frame portion includes a side surface facing the excitation unit, the side surface facing the excitation unit has a curved surface or a planar surface, and the planar surface has a normal line inclined from the first direction to the second direction by a predetermined angle.

16. The piezoelectric vibrating piece according to claim 15, wherein a thickness of the auxiliary frame portion in the third direction is one of a thickness of the framing portion in the third direction, the first thickness, and the second thickness.

17. A piezoelectric device comprising:
the piezoelectric vibrating piece according to claim 1;
a lid plate bonded to one main surface of the framing portion in the piezoelectric vibrating piece; and
a base plate bonded to another main surface of the framing portion in the piezoelectric vibrating piece.

* * * * *